US012794427B2

(12) United States Patent
Luo et al.

(10) Patent No.: US 12,794,427 B2
(45) Date of Patent: Nov. 10, 2026

(54) FOURTH-ORDER FEEDFORWARD-COMPENSATION OPERATIONAL AMPLIFIER AND METHOD FOR DESIGNING THE SAME

(71) Applicant: Chongqing GigaChip Technology Co., Ltd., Chongqing (CN)

(72) Inventors: Yongshuang Luo, Chongqing (CN); Kairang Chen, Chongqing (CN); Youhua Wang, Chongqing (CN); Xianjie Wan, Chongqing (CN); Ji Dong, Chongqing (CN); Bo Ran, Chongqing (CN); Can Zhu, Chongqing (CN); Dongbing Fu, Chongqing (CN)

(73) Assignee: Chongqing GigaChip Technology Co., Ltd., Chongqing (CN)

( * ) Notice: Subject to any disclaimer, the term of this patent is extended or adjusted under 35 U.S.C. 154(b) by 407 days.

(21) Appl. No.: 18/603,201

(22) Filed: Mar. 12, 2024

(65) Prior Publication Data

US 2024/0223140 A1 Jul. 4, 2024

Related U.S. Application Data

(63) Continuation of application No. PCT/CN2021/140254, filed on Dec. 22, 2021.

(30) Foreign Application Priority Data

Oct. 20, 2021 (CN) .......................... 202111221171.3

(51) Int. Cl.
*H03F 3/45* (2006.01)

(52) U.S. Cl.
CPC ....... *H03F 3/4521* (2013.01); *H03F 3/45264* (2013.01); *H03F 3/45269* (2013.01)

(58) Field of Classification Search
CPC ............... H03F 3/4521; H03F 3/45264; H03F 3/45269; H03F 2200/451;
(Continued)

(56) References Cited

U.S. PATENT DOCUMENTS 5,838,194 A * 11/1998 Khoury .................... H03G 7/08 330/279
6,909,292 B1 * 6/2005 Kavadias ........... H03H 11/1291 324/623

(Continued)

FOREIGN PATENT DOCUMENTS

CN 104270107 A 1/2015
CN 105811889 A 7/2016

(Continued)

*Primary Examiner* — John W Poos

(57) ABSTRACT

A fourth-order feedforward compensation operational amplifier is provided. The amplifier includes a first transconductance amplification unit, a second transconductance amplification unit, a third transconductance amplification unit, a fourth transconductance amplification unit, a fifth transconductance amplification unit, a sixth transconductance amplification unit, and a seventh transconductance amplification unit. The first unit, the second unit, the third unit, and the fourth unit are cascaded in sequence to form a fourth-order operational amplifier path. The first unit, the fifth unit, and the fourth unit form a third-order operational amplifier path. The first unit and the sixth unit form a second-order operational amplifier path. The seventh unit forms a first-order operational amplifier path. The first-order path performs feedforward compensation on the second-order path, the second-order path performs feedforward compensation on the third-order path, and the third-order path performs feedforward compensation on the fourth-order path.

11 Claims, 8 Drawing Sheets

(58) Field of Classification Search
CPC . H03F 2203/45288; H03F 2203/45418; H03F 2203/45424; H03F 1/086; H03F 1/3211; H03F 3/45183; H03F 3/45188; H03F 3/45659; H03F 3/45475; H03F 3/45201; H03F 1/38; H03F 3/45179; H03F 1/26; H03F 1/223; H03F 2200/294; H03F 3/193; H03F 3/211; H03F 3/195; H03F 3/245; H03F 3/45192; H03F 1/0205; H03F 1/301; H03F 1/42; H03F 3/68; H03F 2200/372; H03F 2200/453; H03F 1/3205; H03F 2203/45702; H03F 3/19; H03F 3/45; H03F 1/565; H03F 3/72; H03F 2200/318; H03F 3/45076; H03F 1/22; H03F 1/34; H03F 2200/456; H03F 2203/45356; H03F 2200/408; H03F 2203/45051; H03F 2203/45101; H03F 3/45197; H03F 3/45085; H03F 1/0261; H03F 2200/18; H03F 2203/45512; H03F 2203/45528; H03F 3/191; H03F 2203/45544; H03F 2203/45508; H03F 2203/45352; H03F 1/56; H03F 1/083; H03F 3/4565; H03F 2203/45631; H03F 2203/45506; H03H 11/0472; H03H 2011/0494; H03H 11/0433; H03H 11/0422; H03H 11/04; H03H 11/22; H03H 15/00; H03H 1/0007; H03H 7/09; H03H 19/004; H03H 2210/021; H03H 11/0405; H03H 11/0466; H03H 11/481; H03H 11/1291; H03H 11/46; H03H 1/00; H03H 11/0444; H03H 11/1204; H03H 11/1213; H03H 11/18; H03H 11/32; H03H 2210/046; H03H 11/02; H03H 11/0427; H03H 11/08; H03H 11/12; H03H 17/0213; H03H 17/0294; H03H 2210/025; H03H 2210/04; H03H 11/20; H03H 11/245; H03H 11/26; H03H 11/265; H03H 11/42; H03H 15/023; H03H 19/00; H03H 19/008; H03H 2007/0192; H03H 5/12; H03H 1/02; H03H 11/28; H03H 11/346; H03H 11/48; H03H 17/02; H03H 19/002; H03H 7/0115; H03H 7/0161; H03H 7/0169; H03H 7/1741; H03H 7/20; H03H 7/21; H03D 7/1441; H03D 7/1458; H03D 7/1491; H03D 7/16; H03D 2200/0084; H03D 7/1433; H03D 2200/0033; H03D 7/1425; H03D 2200/0025; H03D 2200/0043; H03D 7/1466; H03D 7/1483; H03D 7/165; H03D 2200/0088; H03D 7/18; H03D 2200/0019; H03D 2200/009; H03D 7/12; H03D 7/125; H03D 7/14; H03D 7/161; H03G 1/0088; H03G 1/0023; H03G 3/30; H03G 3/3052; H03G 1/0029; H03G 3/3042; H03G 1/007; H03G 3/18; H03G 3/301; H03G 3/3084; H03G 3/3089; H03G 3/00; H03G 3/001; H03G 1/04; H03G 3/007; H03G 3/20; H03G 3/3036; H03G 3/3063; H03G 3/3068; H03G 3/348; H03G 1/0082; H03G 11/00; H03G 11/004; H03G 2201/103; H03G 3/06; H03G 3/28; H03G 3/3005; H03G 3/3073; H03G 5/26; H03G 7/00; H03G 7/001; H03G 7/08; H03B 5/20; H03B 5/12; H03B 5/04; H03B 2200/0038; H03B 2200/006; H03B 2200/0082; H03B 2200/009; H03B 2201/02; H03B 2202/042; H03B 27/00; H03B 5/06; H03B 5/1206; H03B 5/1212; H03B 5/1228; H03B 5/1234; H03B 5/1243; H03B 5/1265; H03B 5/22; H03B 5/24; H03B 5/36
See application file for complete search history.

(56) References Cited

U.S. PATENT DOCUMENTS

| | | | | |
|---|---|---|---|---|
| 7,312,659 B1 * | 12/2007 | Aram | H03F 3/45475 | 330/253 |
| 7,535,301 B1 * | 5/2009 | Aram | H03F 3/211 | 330/253 |
| 2002/0067208 A1 * | 6/2002 | Ugajin | H03F 3/45179 | 330/258 |
| 2006/0103560 A1 * | 5/2006 | Nagai | H03H 11/0472 | 341/143 |

FOREIGN PATENT DOCUMENTS

| | | |
|---|---|---|
| CN | 106027060 A | 10/2016 |
| CN | 109672418 A | 4/2019 |

* cited by examiner

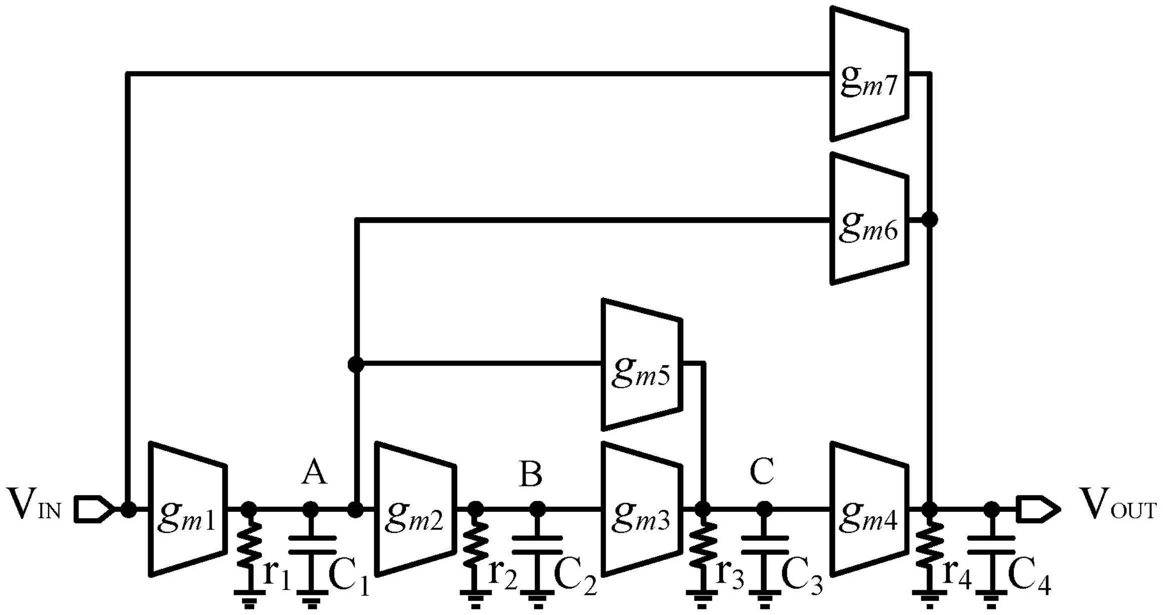
FIG. 10
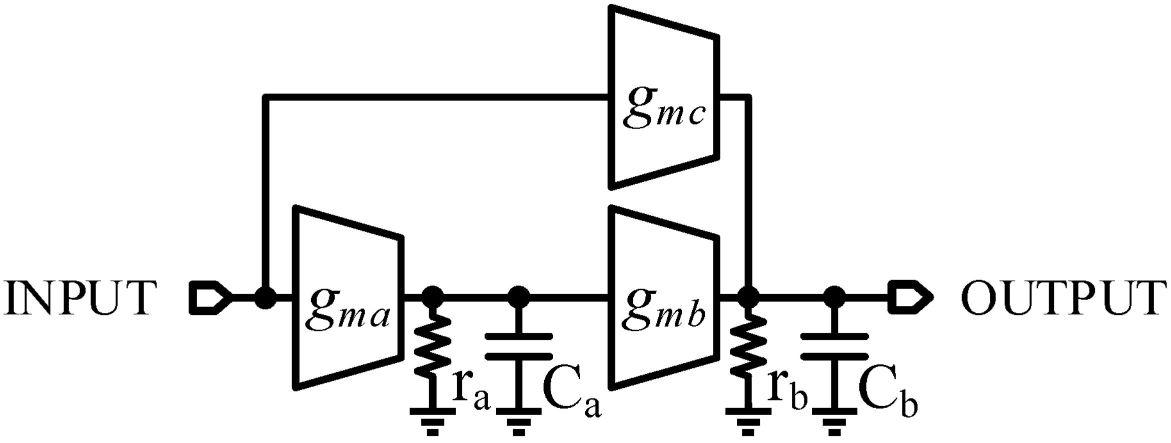
Prior Art FIG. 11

FOURTH-ORDER FEEDFORWARD-COMPENSATION OPERATIONAL AMPLIFIER AND METHOD FOR DESIGNING THE SAME

CROSS REFERENCE TO RELATED APPLICATION

The present disclosure is a continuation application of PCT Application Serial No. PCT/CN2021/140254, filed on Dec. 22, 2021, which claims the priority to a Chinese Application No. CN202111221171.3, filed on Oct. 20, 2021, the contents of all of which are incorporated herein by reference in their entirety for all purposes.

TECHNICAL FIELD

The present disclosure relates to the technical field of integrated circuits, and in particular to a fourth-order feedforward compensation operational amplifier and a method for designing fourth-order feedforward compensation operational amplifier.

BACKGROUND

For a continuous-time bandpass sigma-delta modulator for intermediate frequencies of hundreds of MHz, the gain of the operational amplifier in the loop filter of the modulator needs to meet two performance requirements: (1) a gain of at least 40 dB is required within the signal bandwidth; (2) a gain of 10-20 dB is required at the Nyquist frequency of the modulator. High-order multi-channel feedforward compensation operational amplifiers are suitable for such application scenarios.

X. Yang and others obtained the positions of the four poles and three zeros of the fourth-order feedforward compensation operational amplifier by calculating the transfer function of the operational amplifier. Then, the main path transconductance and the feedforward branch transconductance are constrained so that the three zero points are approximately equal and are within the unit gain bandwidth of the amplifier so that the designed feedforward operational amplifier maintains a gain of at least 40 dB within a bandwidth of up to several hundred MHz while satisfying the conditional stability. F. T. Gebreyohannes et al. proposed an algorithm for designing operational amplifiers in continuous-time bandpass sigma-delta modulators based on the $g_m/I_D$ method. In this algorithm, each device in the operational amplifier is designed as code in the algorithm, and the amplifier is designed by writing the code based on the $g_m/I_D$ method for operational amplifier design according to the performance requirements of the feedforward operational amplifier to be designed and the physical constraints of the device process.

SUMMARY

Exemplary embodiments of the present disclosure provide fourth-order feedforward compensation operational amplifiers and methods of designing the same.

In exemplary embodiments, a fourth-order feedforward compensation operational amplifier includes: a first transconductance amplification unit, a second transconductance amplification unit, a third transconductance amplification unit, a fourth transconductance amplification unit, a fifth transconductance amplification unit, a sixth transconductance amplification unit, and the seventh transconductance amplification unit.

In exemplary embodiments, the first transconductance amplification unit, the second transconductance amplification unit, the third transconductance amplification unit, and the fourth transconductance amplification unit are cascaded in sequence, and the first transconductance amplification unit, the second transconductance amplification unit, the third transconductance amplification unit, and the fourth transconductance amplification unit form a fourth-order operational amplifier path.

In exemplary embodiments, an input terminal of the fifth transconductance amplification unit is connected to an output terminal of the first transconductance amplification unit, an output terminal of the fifth transconductance amplification unit is connected to an input terminal of the fourth transconductance amplification unit, and the first transconductance amplification unit, the fifth transconductance amplification unit, and the fourth transconductance amplification unit form a third-order operational amplifier path.

In exemplary embodiments, an input terminal of the sixth transconductance amplification unit is connected to the output terminal of the first transconductance amplification unit, and an output terminal of the sixth transconductance amplification unit is connected to an output terminal of the fourth transconductance amplification unit, and the first transconductance amplification unit and the sixth transconductance amplification unit form a second-order operational amplifier path.

In exemplary embodiments, an input terminal of the seventh transconductance amplification unit is connected to the input terminal of the first transconductance amplification unit, and an output terminal of the seventh transconductance amplification unit is connected to the output terminal of the fourth transconductance amplification unit, and the seventh transconductance amplification unit forms a first-order operational amplifier path.

In exemplary embodiments, the first-order operational amplifier path is configured to perform feedforward compensation on the second-order operational amplifier path, the second-order operational amplifier path is configured to perform feedforward compensation on the third-order operational amplifier path, and the third-order operational amplifier path is configured to perform feedforward compensation on the fourth-order operational amplifier path.

In exemplary embodiments, the first transconductance amplification unit adopts a cascode differential amplification structure.

In exemplary embodiments, the first transconductance amplification unit includes a first PMOSFET, a second PMOSFET, a third PMOSFET, a fourth PMOSFET, a first NMOSFET, a second NMOSFET, a third NMOSFET, a fourth NMOSFET, and fifth NMOSFET.

In exemplary embodiments, the source of the first PMOSFET is connected to an operating voltage VDD, a gate of the first PMOSFET is connected to a drain of the first PMOSFET, a source of the second PMOSFET is connected to the operating voltage, a gate of the second PMOSFET is connected to a drain of the third PMOSFET, a drain of the second PMOSFET is connected to a gate of the third PMOSFET, the drain of the second PMOSFET is connected to the drain of the first PMOSFET, a source of the third PMOSFET is connected to the operating voltage, the drain of the third PMOSFET is also connected to a drain of the fourth PMOSFET, a source of the fourth PMOSFET is connected to the operating voltage, a gate of the fourth PMOSFET is connected to the drain of the fourth PMOSFET, a drain of the first NMOSFET is connected to the drain of the first PMOSFET, the drain of the first NMOSFET serves as a negative differential output terminal, a gate of the first NMOSFET is connected to a first bias voltage, a source of the first NMOSFET is connected to a drain of the second NMOSFET, a gate of the second NMOSFET serves as a positive differential input terminal, a source of the second NMOSFET is connected to a drain of the third NMOSFET, a gate of the third NMOSFET is connected to a second bias voltage, a source of the third NMOSFET is connected to ground, a drain of the third NMOSFET is also connected to a source of the fourth NMOSFET, a gate of the fourth NMOSFET serves as a negative differential input terminal, a drain of the fourth NMOSFET is connected to a source of the fifth NMOSFET, a gate of the fifth NMOSFET is connected to the first bias voltage, a drain of the fifth NMOSFET is connected to the drain of the third PMOSFET, and the drain of the fifth NMOSFET serves as a positive differential output terminal.

In exemplary embodiments, the second transconductance amplification unit adopts a differential amplification structure.

In exemplary embodiments, the second transconductance amplification unit includes a fifth PMOSFET, a sixth PMOSFET, a seventh PMOSFET, an eighth PMOSFET, a sixth NMOSFET, a seventh NMOSFET, and an eighth NMOSFET.

In exemplary embodiments, a source of the fifth PMOSFET is connected to the operating voltage, a gate of the fifth PMOSFET is connected to a drain of the fifth PMOSFET, a source of the sixth PMOSFET is connected to the operating voltage, a gate of the sixth PMOSFET is connected to a drain of the seventh PMOSFET, a drain of the sixth PMOSFET is connected to a gate of the seventh PMOSFET, the drain of the sixth PMOSFET is also connected to the drain of the fifth PMOSFET, a source of the seventh PMOSFET is connected to the operating voltage, the drain of the seventh PMOSFET is also connected to a drain of the eighth PMOSFET, a source of the eighth PMOSFET is connected to the operating voltage, a gate of the eighth PMOSFET is connected to the drain of the eighth PMOSFET, a drain of the sixth NMOSFET is connected to the drain of the fifth PMOSFET, the drain of the sixth NMOSFET serves as a negative differential output terminal, a gate of the sixth NMOSFET serves as a positive differential input terminal, a source of the sixth NMOSFET is connected to a drain of the seventh NMOSFET, a gate of the seventh NMOSFET is connected to a third bias voltage, a source of the seventh NMOSFET is connected to the ground, the drain of the seventh NMOSFET is also connected to a source of the eighth NMOSFET, a gate of the eighth NMOSFET serve as a negative differential input terminal, a drain of the eighth NMOSFET is connected to the drain of the seventh PMOSFET, and the drain of the eighth NMOSFET serves as a positive differential output terminal.

In exemplary embodiments, the second transconductance amplification unit adopts a differential amplification structure.

In exemplary embodiments, the second transconductance amplification unit includes a fifth PMOSFET, a sixth PMOSFET, a seventh PMOSFET, an eighth PMOSFET, a sixth NMOSFET, a seventh NMOSFET, and an eighth NMOSFET.

In exemplary embodiments, a source of the fifth PMOSFET is connected to the operating voltage, a gate of the fifth PMOSFET is connected to a drain of the fifth PMOSFET, a source of the sixth PMOSFET is connected to the operating voltage, a gate of the sixth PMOSFET is connected to a drain of the seventh PMOSFET, a drain of the sixth PMOSFET is connected to a gate of the seventh PMOSFET, the drain of the sixth PMOSFET is also connected to the drain of the fifth PMOSFET, a source of the seventh PMOSFET is connected to the operating voltage, the drain of the seventh PMOSFET is also connected to a drain of the eighth PMOSFET, a source of the eighth PMOSFET is connected to the operating voltage, a gate of the eighth PMOSFET is connected to the drain of the eighth PMOSFET, a drain of the sixth NMOSFET is connected to the drain of the fifth PMOSFET, the drain of the sixth NMOSFET serves as a negative differential output terminal, a gate of the sixth NMOSFET serves as a positive differential input terminal, a source of the sixth NMOSFET is connected to a drain of the seventh NMOSFET, a gate of the seventh NMOSFET is connected to a third bias voltage, a source of the seventh NMOSFET is connected to the ground, the drain of the seventh NMOSFET is also connected to a source of the eighth NMOSFET, a gate of the eighth NMOSFET serve as a negative differential input terminal, a drain of the eighth NMOSFET is connected to the drain of the seventh PMOSFET, and the drain of the eighth NMOSFET serves as a positive differential output terminal.

In exemplary embodiments, the third transconductance amplification unit adopts a differential amplification structure with common mode feedback.

In exemplary embodiments, the third transconductance amplification unit includes a ninth PMOSFET, a tenth PMOSFET, an eleventh PMOSFET, a twelfth PMOSFET, a ninth NMOSFET, a tenth NMOSFET, an eleventh NMOSFET, a first operational amplifier, a first resistor, and a second resistor.

In exemplary embodiments, a source of the ninth PMOSFET is connected to the operating voltage, a gate of the ninth PMOSFET serves as a first positive differential input terminal, a drain of the ninth PMOSFET is connected to a drain of the tenth PMOSFET, a source of the tenth PMOSFET is connected to the operating voltage, a gate of the tenth PMOSFET is connected to a gate of the eleventh PMOSFET, a source of the eleventh PMOSFET is connected to the operating voltage, a drain of the eleventh PMOSFET is connected to a drain of the twelfth PMOSFET, a source of the twelfth PMOSFET is connected to the operating voltage, a gate of the twelfth PMOSFET serves as a first negative differential input terminal, a drain of the ninth NMOSFET is connected to the drain of the ninth PMOSFET, the drain of the ninth NMOSFET serves as a negative differential output terminal, a gate of the ninth NMOSFET serves as a second positive differential input terminals, a source of the ninth NMOSFET is connected to a drain of the tenth NMOSFET, a gate of the tenth NMOSFET is connected to a fourth bias voltage, a source of the tenth NMOSFET is connected to the ground, the drain of the tenth NMOSFET is also connected to a source of the eleventh NMOSFET, a gate of the eleventh NMOSFET serves as a second negative differential input terminal, a drain of the eleventh NMOSFET is connected to the drain of the eleventh PMOSFET, the drain of the eleventh NMOSFET serves as a positive differential output terminal, a non-inverting input terminal of the first operational amplifier is connected to one end of the first resistor, the other end of the first resistor is connected to the drain of the ninth NMOSFET, the non-inverting input terminal of the first operational amplifier is also connected to one end of the second resistor, the other end of the second resistor is connected to the drain of the eleventh NMOSFET, an inverting input terminal of the first operational amplifier is connected to a first reference signal, and an output terminal of the first operational amplifier is connected to the gate of the tenth PMOSFET.

In exemplary embodiments, the fourth transconductance amplification unit adopts a complementary differential amplification structure with common mode feedback.

In exemplary embodiments, the fourth transconductance amplification unit includes a thirteenth PMOSFET, a fourteenth PMOSFET, a fifteenth PMOSFET, a sixteenth PMOSFET, a seventeenth PMOSFET, an eighteenth PMOSFET, a twelfth NMOSFET, a thirteenth NMOSFET, a fourteenth NMOSFET, a second operational amplifier, a third resistor, and a fourth resistor.

In exemplary embodiments, a source of the thirteenth PMOSFET is connected to the operating voltage, a gate of the thirteenth PMOSFET serves as a first positive differential input terminal, a drain of the thirteenth PMOSFET is connected to a drain of the fourteenth PMOSFET, a source of the fourteenth PMOSFET is connected to the operating voltage, a gate of the fourteenth PMOSFET is connected to a gate of the fifteenth PMOSFET, a source of the fifteenth PMOSFET is connected to the operating voltage, a drain of the fifteenth PMOSFET is connected to a drain of the sixteenth PMOSFET, a source of the sixteenth PMOSFET is connected to the operating voltage, a gate of the sixteenth PMOSFET serves as a first negative differential input terminal, a source of the seventeenth PMOSFET is connected to the operating voltage, a drain of the seventeenth PMOSFET is connected to the drain of the fourteenth PMOSFET, a source of the eighteenth PMOSFET is connected to the operating voltage, a drain of the eighteenth PMOSFET is connected to the drain of the fifteenth PMOSFET, a drain of the twelfth NMOSFET is connected to the drain of the fourteenth PMOSFET, the drain of the twelfth NMOSFET serves as a negative differential output terminal, a gate of the twelfth NMOSFET is connected to a gate of the seventeenth PMOSFET and serves as a second positive differential input terminal, a source of the twelfth NMOSFET is connected to a drain of the thirteenth NMOSFET, a gate of the thirteenth NMOSFET is connected to a fifth bias Voltage, a source of the thirteenth NMOSFET is connected to the ground, the drain of the thirteenth NMOSFET is also connected to a source of the fourteenth NMOSFET, a gate of the fourteenth NMOSFET is connected to a gate of the eighteenth PMOSFET and serves as a second negative differential input terminal, a drain of the fourteenth NMOSFET is connected to the drain of the fifteenth PMOSFET, the drain of the fourteenth NMOSFET serves as a positive differential output terminal, a non-inverting input terminal of the second operational amplifier is connected to one end of the third resistor, the other end of the third resistor is connected to the drain of the twelfth NMOSFET, a non-inverting input terminal of the second operational amplifier is also connected to one end of the fourth resistor, the other end of the fourth resistor is connected to the drain of the fourteenth NMOSFET, an inverting input terminal of the second operational amplifier is connected to a second reference signal, and an output terminal of the second operational amplifier is connected to the gate of the fourteenth PMOSFET.

In exemplary embodiments, the fifth transconductance amplification unit adopts a differential amplification structure with common mode feedback.

In exemplary embodiments, the fifth transconductance amplification unit includes a nineteenth PMOSFET, a twentieth PMOSFET, a twenty-first PMOSFET, a twenty-second PMOSFET, a fifteenth NMOSFET, a sixteenth NMOSFET, a seventeenth NMOSFET, a third operational amplifier, a fifth resistor, and a sixth resistor.

In exemplary embodiments, a source of the nineteenth PMOSFET is connected to the operating voltage, a gate of the nineteenth PMOSFET serves as a first positive differential input terminal, a drain of the nineteenth PMOSFET is connected to a drain of the twentieth PMOSFET, a source of the twentieth PMOSFET is connected to the operating voltage, a gate of the twentieth PMOSFET is connected to a gate of the twenty-first PMOSFET, a source of the twenty-first PMOSFET is connected to the operating voltage, a drain of the twenty-first PMOSFET is connected to a drain of the twenty-second PMOSFET, a source of the twenty-second PMOSFET is connected to the operating voltage, a gate of the twenty-second PMOSFET serves as a first negative differential input terminal, a drain of the fifteenth NMOSFET is connected to the drain of the nineteenth PMOSFET, the drain of the fifteenth NMOSFET serves as a negative differential output terminal, a gate of the fifteenth NMOSFET serves as a second positive differential input terminal, a source of the fifteenth NMOSFET is connected to a drain of the sixteenth NMOSFET, a gate of the sixteenth NMOSFET is connected to a sixth bias voltage, a source of the sixteenth NMOSFET is connected to the ground, the drain of the sixteenth NMOSFET is also connected to a source of the seventeenth NMOSFET, a gate of the seventeenth NMOSFET serves as a second negative differential input terminal, a drain of the seventeenth NMOSFET is connected to the drain of the twenty-first PMOSFET, the drain of the seventeenth NMOSFET serves as a positive differential output terminal, a non-inverting input terminal of the third operational amplifier is connected to one end of the fifth resistor, the other end of the fifth resistor is connected to the drain of the fifteenth NMOSFET, the non-inverting input terminal of the third operational amplifier is also connected to one end of the sixth resistor, the other end of the sixth resistor is connected to the drain of the seventeenth NMOSFET, an inverting input terminal of the third operational amplifier is connected to a third reference signal, and an output terminal of the third operational amplifier is connected to the gate of the twentieth PMOSFET.

In exemplary embodiments, the sixth transconductance amplification unit adopts a complementary differential amplification structure with common mode feedback.

In exemplary embodiments, the sixth transconductance amplification unit includes a twenty-third PMOSFET, a twenty-fourth PMOSFET, a twenty-fifth PMOSFET, a twenty-sixth PMOSFET, a twenty-seventh PMOSFET, a twenty-eighth PMOSFET, an eighteenth NMOSFET, a nineteenth NMOSFET, a twentieth NMOSFET, a fourth operational amplifier, a seventh resistor, and an eighth resistor.

In exemplary embodiments, a source of the twenty-third PMOSFET is connected to the operating voltage, a gate of twenty-third PMOSFET serves as a first positive differential input terminal, a drain of the twenty-third PMOSFET is connected to a drain of the twenty-fourth PMOSFET, a source of the twenty-fourth PMOSFET is connected to the operating voltage, a gate of the twenty-fourth PMOSFET is connected to a gate of the twenty-fifth PMOSFET, a source of the twenty-fifth PMOSFET is connected to the operating voltage, a drain of the twenty-fifth PMOSFET is connected to a drain of the twenty-sixth PMOSFET, a source of the twenty-sixth PMOSFET is connected to the operating voltage, a gate of the twenty-sixth PMOSFET serves as a first negative differential input terminal, a source of the twenty-seventh PMOSFET is connected to the operating voltage, a drain of the twenty-seventh PMOSFET is connected to the drain of the twenty-fourth PMOSFET, a source of the twenty-eighth PMOSFET is connected to the operating voltage, a drain of the twenty-eighth PMOSFET is connected to the drain of the twenty-fifth PMOSFET, a drain of the eighteenth NMOSFET is connected to the drain of the twenty-fourth PMOSFET, the drain of the eighteenth NMOSFET serves as a negative differential output terminal, a gate of the eighteenth NMOSFET is connected to a gate of the twenty-seventh PMOSFET and serves as a second positive differential input terminal, a source of the eighteenth NMOSFET is connected to a drain of the nineteenth NMOSFET, a gate of the nineteenth NMOSFET is connected to a seventh bias voltage, a source of the nineteenth NMOSFET is connected to the ground, the drain of the nineteenth NMOSFET is also connected to a source of the twentieth NMOSFET, a gate of the twentieth NMOSFET is connected to a gate of the twenty-eighth PMOSFET and serves as a second negative differential input terminal, a drain of the twentieth NMOSFET is connected to the drain of the twenty-fifth PMOSFET, the drain of the twentieth NMOSFET serves as a positive differential output terminal, a non-inverting input terminal of the fourth operational amplifier is connected to one end of the seventh resistor, the other end of the seventh resistor is connected to the drain of the eighteenth NMOSFET, the non-inverting input terminal of the fourth operational amplifier is also connected to one end of the eighth resistor, the other end of the eighth resistor is connected to the drain of the twentieth NMOSFET, an inverting input terminal of the fourth operational amplifier is connected to a fourth reference signal, and an output terminal of the fourth operational amplifier is connected to the gate of the twenty-fourth PMOSFET.

In exemplary embodiments, the seventh transconductance amplification unit adopts a complementary differential amplification structure.

In exemplary embodiments, the seventh transconductance amplification unit includes a twenty-ninth PMOSFET, a thirtieth PMOSFET, a thirty-first PMOSFET, a thirty-second PMOSFET, a thirty-third PMOSFET, a thirty-fourth PMOSFET, a twenty-first NMOSFET, a twenty-second NMOSFET, a twenty-third NMOSFET, a first capacitor, and a second capacitor.

In exemplary embodiments, a source of the twenty-ninth PMOSFET is connected to the operating voltage, a gate of the twenty-ninth PMOSFET is connected to a drain of the twenty-ninth PMOSFET, the drain of the twenty-ninth PMOSFET is connected to a drain of the thirtieth PMOSFET, a source of the thirtieth PMOSFET is connected to the operating voltage, a gate of the thirtieth PMOSFET is connected to a drain of the thirty-first PMOSFET, a source of the thirty-first PMOSFET is connected to the operating voltage, a gate of the thirty-first PMOSFET is connected to the drain of the thirtieth PMOSFET, the drain of the thirty-first PMOSFET is connected to a drain of the thirty-second PMOSFET, a source of the thirty-second PMOSFET is connected to the operating voltage, a gate of the thirty-second PMOSFET is connected to the drain of the thirty-second PMOSFET, a source of the thirty-third PMOSFET is connected to the operating voltage, a drain of the thirty-third PMOSFET is connected to the drain of the thirtieth PMOSFET, a source of the thirty-fourth PMOSFET is connected to the operating voltage, a drain of the thirty-fourth PMOSFET is connected to the drain of the thirty-first PMOSFET, a drain of the twenty-first NMOSFET is connected to the drain of the thirtieth PMOSFET, the drain of the twenty-first NMOSFET is connected to one end of the first capacitor, the other end of the first capacitor serves as a negative differential output terminal, a gate of the twenty-first NMOSFET is connected to a gate of the thirty-third PMOSFET and serves as a positive differential input terminal, a source of the twenty-first NMOSFET is connected to a drain of the twenty-second NMOSFET, a gate of the twenty-second NMOSFET is connected to an eighth bias voltage, a source of the twenty-second NMOSFET is connected to the ground, the drain of the twenty-second NMOSFET is also connected to a source of the twenty-third NMOSFET, a gate of the twenty-third NMOSFET is connected to a gate of the thirty-fourth PMOSFET and serves as a negative differential input terminal, a drain of the twenty-third NMOSFET is connected to the drain of the thirty-first PMOSFET, and the drain of the twenty-third NMOSFET is connected to one end of the second capacitor, and the other end of the second capacitor serves as a positive differential output terminal.

In exemplary embodiments, the fourth-order feedforward compensation operational amplifier is designed based on a 65 nm CMOS process.

In exemplary embodiments, a method for designing a fourth-order feedforward compensation operational amplifier includes: providing a first transconductance amplification unit, a second transconductance amplification unit, a third transconductance amplification unit, a fourth transconductance amplification unit, a fifth transconductance amplification unit, a sixth transconductance amplification unit, and a seventh transconductance amplification unit; using the first transconductance amplification unit, the second transconductance amplification unit, the third transconductance amplification unit, and the fourth transconductance amplification unit to form a fourth-order operational amplifier path; using the first transconductance amplification unit, the fifth transconductance amplification unit, and the fourth transconductance amplification unit to form a third-order operational amplifier path, and performing feedforward compensation on the fourth-order operational amplifier path through the third-order operational amplifier path; using the first transconductance amplification unit and the sixth transconductance amplification unit to form a second-order operational amplifier path, and performing feedforward compensation on the third-order operational amplifier path through the second-order operational amplifier path; and using the seventh transconductance amplifier unit to form a first-order operational amplifier path, and performing feedforward compensation on the second-order operational amplifier path through the first-order operational amplifier path.

In exemplary embodiments, the first transconductance amplification unit is formed based on a cascode differential amplification technology.

In exemplary embodiments, the second transconductance amplification unit is formed based on a differential amplification technology.

In exemplary embodiments, the third transconductance amplification unit and the fifth transconductance amplification unit are formed based on a differential amplification technology with common mode feedback.

In exemplary embodiments, the fourth transconductance amplification unit and the sixth transconductance amplification unit are formed based on a complementary differential amplification technology with common mode feedback.

In exemplary embodiments, the seventh transconductance amplification unit is formed based on a complementary differential amplification technology.

BRIEF DESCRIPTION OF DRAWINGS

FIG. 10 shows a structural equivalent schematic diagram of a fourth-order feedforward compensation operational amplifier according to exemplary embodiments of the present disclosure;

FIG. 11 shows a structural equivalent schematic diagram of a second-order feedforward compensation operational amplifier of prior art;

DESCRIPTION OF EMBODIMENTS

Figure 1:
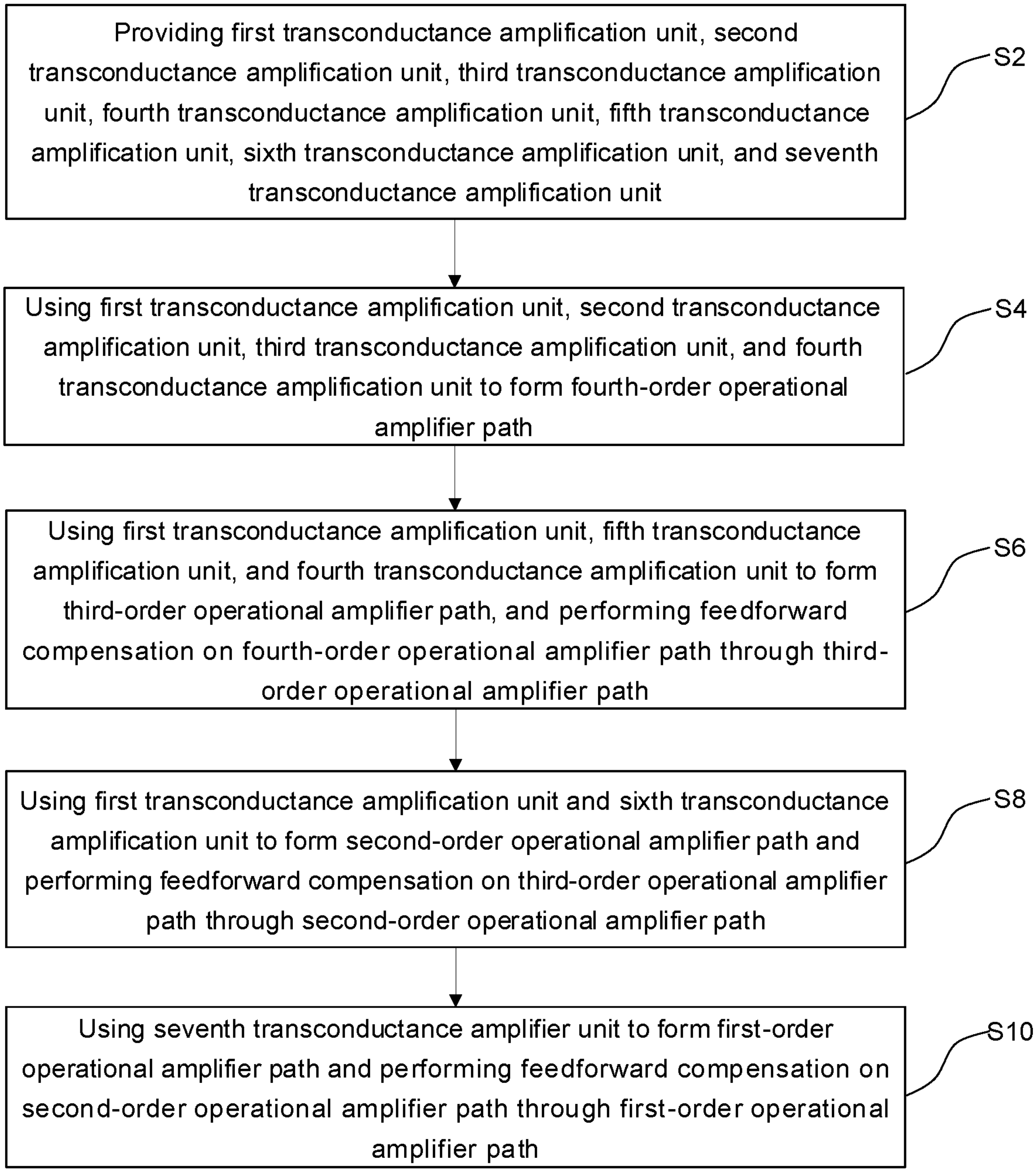
FIG. 1 shows a flow chart of operations of a method for designing a fourth-order feedforward compensation operational amplifier according to exemplary embodiments of the present disclosure.

The following describes the embodiments of the present disclosure through specific examples. Those skilled in the art can easily understand other advantages and effects of the present disclosure from the content disclosed in this specification. The present disclosure can also be implemented or applied through other different specific embodiments. Various details in this specification can also be modified or changed in various ways based on different viewpoints and applications without departing from the present disclosure.

See FIG. 1 through FIG. 13. It should be noted that the diagrams provided in one or more embodiments only illustrate the basic concept of the present disclosure in a schematic manner. The drawings only show the components related to the present disclosure and the number, shape, and scale of the components may not be drawn according to actual implementation. During actual implementation, the type, quantity, and scale of each component may be arbitrarily changed, and the layout of the components may also be more complex. The structures, proportions, sizes, etc. shown in the drawings attached to this specification are only used to coordinate with the content disclosed in the specification and are for the understanding and reading of those familiar with this technology. They are not used to limit the conditions for the implementation of the present disclosure, so it has no technical substantive significance. Any structural modifications, changes in proportions, or size adjustments, without affecting the effects that the present disclosure can produce and the purposes that can be achieved, should still fall within the scope covered by the technical content disclosed by the present disclosure.

As mentioned above, the inventor found through research that: for continuous-time bandpass sigma-delta modulators used for intermediate frequencies of hundreds of MHz, the traditional second-order Miller compensation operational amplifier is difficult to meet its gain performance requirements, and only high-order multi-channel feedforward compensation operational amplifiers may meet those gain performance requirements. However, as the order of high-order multi-channel feedforward compensation operational amplifiers increases and the complexity of their structures increases, it may be difficult for designers to design high-order multi-channel feedforward compensation operational amplifiers that meet specific needs. In conventional technology, either the system transfer function of a high-order multi-channel feedforward operational amplifier is derived based on cumbersome mathematical operations where the complexity of calculations its transfer function increases as the amplifier order increases or the amplifier system structure becomes more complex, or the amplifier is designed based on code writing algorithms that completely abandon the physical structure, i.e., by writing the code based on the $g_m/I_D$ method for operational amplifier design according to the performance requirements of the feedforward operational amplifier to be designed and the physical constraints of the device process. However, the code-writing algorithm does not analyze and understand the amplifier circuit itself and loses an in-depth understanding of the circuit stages of high-order multi-channel feedforward operational amplifiers.

Figure 2:
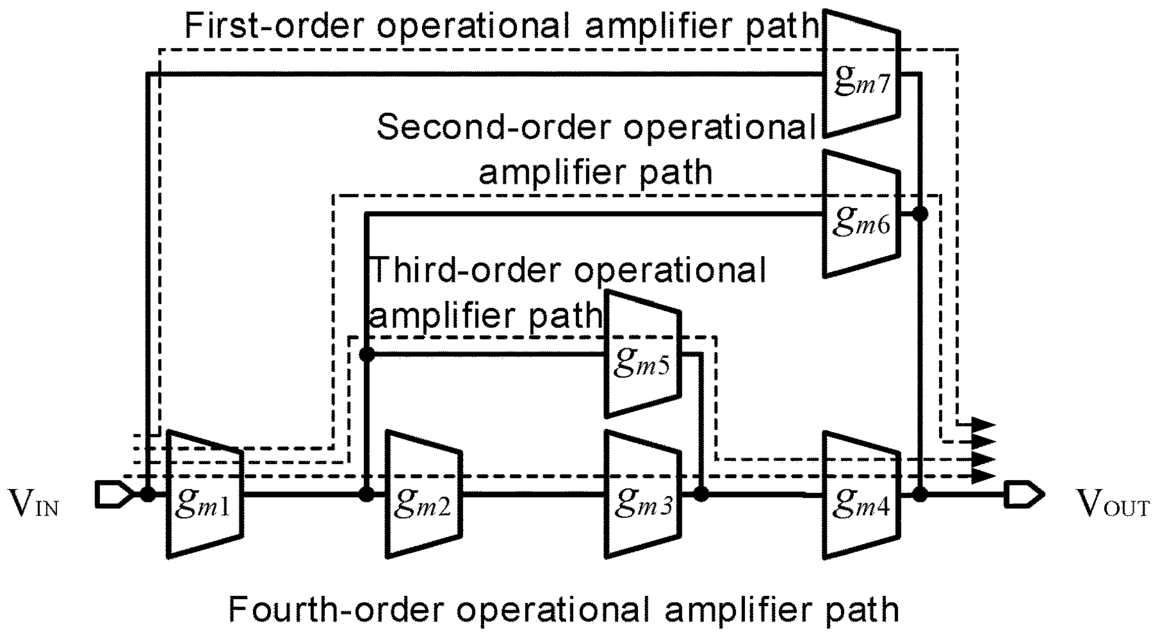
FIG. 2 shows a schematic structural diagram of a fourth-order feedforward compensation operational amplifier according to exemplary embodiments of the present disclosure.

Based on this, as shown in FIGS. 1 and 2, exemplary embodiments of the present disclosure propose a design method for designing a fourth-order feedforward compensation operational amplifier. In exemplary embodiments, the method includes the following operations S2, S4, S6, S8, and S10.

S2: providing a first transconductance amplification unit $g_{m1}$, a second transconductance amplification unit $g_{m2}$, a third transconductance amplification unit $g_{m3}$, a fourth transconductance amplification unit $g_{m4}$, a fifth transconductance amplification unit $g_{m5}$, and a sixth transconductance amplification unit $g_{m6}$, and the seventh transconductance amplification unit $g_{m7}$.

S4: using the first transconductance amplification unit $g_{m1}$, the second transconductance amplification unit $g_{m2}$, the third transconductance amplification unit $g_{m3}$, and the fourth transconductance amplification unit $g_{m4}$ to form a fourth-order operational amplifier path.

S6: using the first transconductance amplification unit $g_{m1}$, the fifth transconductance amplification unit $g_{m5}$, and the fourth transconductance amplification unit $g_{m4}$ to form a third-order operational amplifier path, and performing feedforward compensation on the fourth-order operational amplifier path through the third-order operational amplifier path.

S8: using the first transconductance amplification unit $g_{m1}$ and the sixth transconductance amplification unit $g_{m6}$ to form a second-order operational amplifier path, and performing feedforward compensation on the third-order operational amplifier path through the second-order operational amplifier path.

S10: using the seventh transconductance amplification unit $g_{m7}$ to form a first-order operational amplifier path, and performing feedforward compensation on the second-order operational amplifier path through the first-order operational amplifier path.

In exemplary embodiments, in S2, the first transconductance amplification unit $g_{m1}$ is formed based on cascode (in other words, CSCG, i.e., common source common gate) differential amplification technology, the second transconductance amplification unit $g_{m2}$ is formed based on differential amplification technology, the third transconductance amplification unit $g_{m3}$ and the fifth transconductance amplification unit $g_{m5}$ are formed based on common mode feedback differential amplification technology, the fourth transconductance amplification unit $g_{m4}$ and the sixth transconductance amplification unit $g_{m6}$ are formed based on common mode feedback complementary differential amplification technology, and the seventh transconductance amplification unit $g_{m7}$ is formed based on complementary differential amplification technology.

In exemplary embodiments, operations S4, S6, S8, and S10 are executed to obtain a fourth-order feedforward compensation operational amplifier as shown in FIG. 2. In exemplary embodiments, the fourth-order feedforward compensation operational amplifier includes a first transconductance amplification unit $g_{m1}$, a second transconductance amplification unit $g_{m2}$, a third transconductance amplification unit $g_{m3}$, a fourth transconductance amplification unit $g_{m4}$, a fifth transconductance amplification unit $g_{m5}$, a sixth transconductance amplification unit $g_{m6}$, and a seventh transconductance amplification unit $g_{m7}$. In exemplary embodiments, the first transconductance amplification unit $g_{m1}$, the second transconductance amplification unit $g_{m2}$, the third transconductance amplification unit $g_{m3}$, and the fourth transconductance amplification unit $g_{m4}$ are cascaded in sequence to form a fourth-order operational amplifier path. In exemplary embodiments, an input terminal of the fifth transconductance amplification unit $g_{m5}$ is connected to an output terminal of the first transconductance amplification unit $g_{m1}$, an output terminal of the fifth transconductance amplification unit $g_{m5}$ is connected to an input terminal of the fourth transconductance amplification unit $g_{m4}$, and the first transconductance amplification unit $g_{m1}$, the fifth transconductance amplification unit $g_{m5}$, and the fourth transconductance amplification unit $g_{m4}$ form a third-order operational amplifier path. In exemplary embodiments, an input terminal of the sixth transconductance amplification unit $g_{m6}$ is connected to the output terminal of the first transconductance amplification unit $g_{m1}$, an output terminal of the sixth transconductance amplification unit $g_{m6}$ is connected to an output terminal of the fourth transconductance amplification unit $g_{m4}$, and the first transconductance amplification unit $g_{m1}$ and the sixth transconductance amplification unit $g_{m6}$ form a second-order operational amplifier path. In exemplary embodiments, an input terminal of the seventh transconductance amplification unit $g_{m7}$ is connected to the input terminal of the first transconductance amplification unit $g_{m1}$, an output terminal of the seventh transconductance amplification unit $g_{m7}$ is connected to the output terminal of the fourth transconductance amplification unit $g_{m4}$, and the seventh transconductance amplification unit $g_{m7}$ forms a first-order operational amplifier path. In exemplary embodiments, the first-order operational amplifier path performs feedforward compensation on the second-order operational amplifier path, the second-order operational amplifier path performs feedforward compensation on the third-order operational amplifier path, and the third-order operational amplifier path performs feedforward compensation on the fourth-order operational amplifier path. That is, for two adjacent operational amplifier paths, the one with a lower order performs feedforward compensation on the one with a higher order.

In exemplary embodiments, the fourth-order feedforward compensation operational amplifier is designed and completed based on a 65 nm CMOS process.

Figure 3:
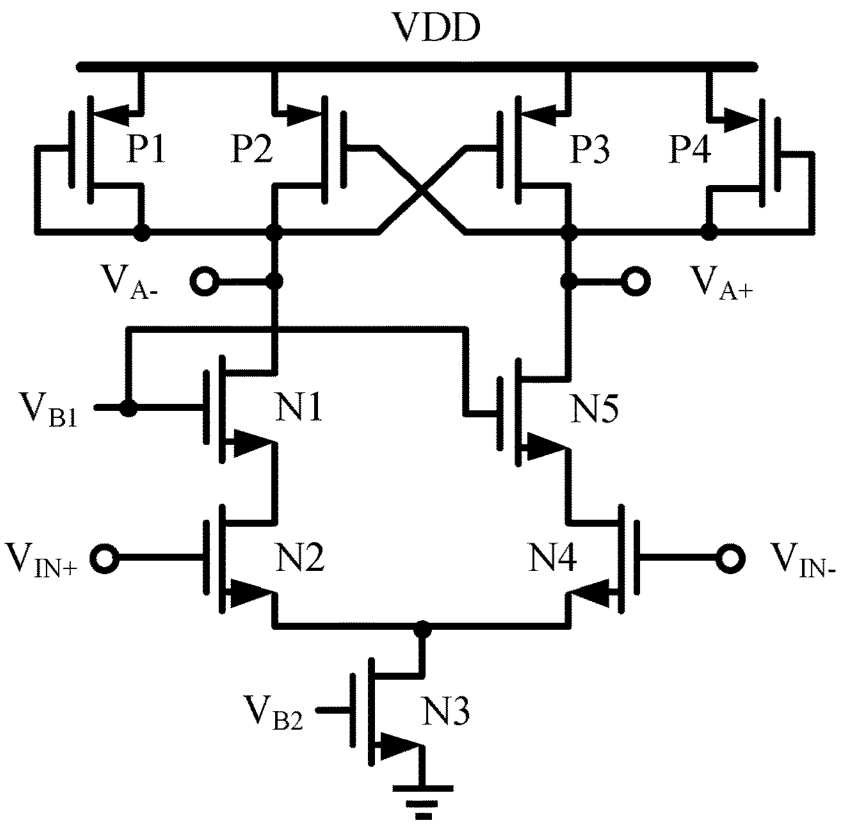
FIG. 3 shows a circuit structure diagram of a first transconductance amplification unit $g_{m1}$ according to exemplary embodiments of the present disclosure.

In exemplary embodiments of the present disclosure, as shown in FIG. 3, the first transconductance amplification unit $g_{m1}$ adopts a cascode differential amplification structure. In exemplary embodiments, the first transconductance amplification unit $g_{m1}$ includes a first PMOSFET (i.e., p-type MOSFET) P1, a second PMOSFET P2, a third PMOSFET P3, a fourth PMOSFET P4, a first NMOSFET (i.e., n-type MOSFET) N1, a second NMOSFET N2, a third NMOSFET N3, a fourth NMOSFET N4, and a fifth NMOSFET N5. In exemplary embodiments, the source of the first PMOSFET P1 is connected to an operating voltage VDD, the gate of the first PMOSFET P1 is connected to the drain of the first PMOSFET P1, the source of the second PMOSFET P2 is connected to the operating voltage VDD, the gate of the second PMOSFET P2 is connected to the drain of the third PMOSFET P3, the drain of the second PMOSFET P2 is connected to the gate of the third PMOSFET P3, the drain of the second PMOSFET P2 is connected to the drain of the first PMOSFET P1, the source of the third PMOSFET P3 is connected to the operating voltage VDD, the drain of the third PMOSFET P3 is also connected to the drain of the fourth PMOSFET P4, the source of the fourth PMOSFET P4 is connected to the operating voltage VDD, the gate of the fourth PMOSFET P4 is connected to the drain of the fourth PMOSFET P4, the drain of the first NMOSFET N1 is connected to the drain of the first PMOSFET P1, the drain of the first NMOSFET N1 serves as a negative differential output terminal $V_{A-}$, the gate of the first NMOSFET N1 is connected to a first bias voltage $V_{B1}$, the source of the first NMOSFET N1 is connected to the drain of the second NMOSFET N2, the gate of the second NMOSFET N2 serves as a positive differential input terminal $V_{IN+}$, the source of the second NMOSFET N2 is connected to the drain of the third NMOSFET N3, the gate of the third NMOSFET N3 is connected to a second bias voltage $V_{B2}$, the source of the third NMOSFET N3 is connected to the ground, the drain of the third NMOSFET N3 is also connected to the source of the fourth NMOSFET N4, the gate of the fourth NMOSFET N4 serves as a negative differential input terminal $V_{IN-}$, the drain of the fourth NMOSFET N4 is connected to the source of the fifth NMOSFET N5, the gate of the fifth NMOSFET N5 is connected to the first bias voltage $V_{B1}$, the drain of the fifth NMOSFET N5 is connected to the drain of the third PMOSFET P3, and the drain of the fifth NMOSFET N5 serves as a positive differential output terminal $V_{A+}$.

Figure 4:
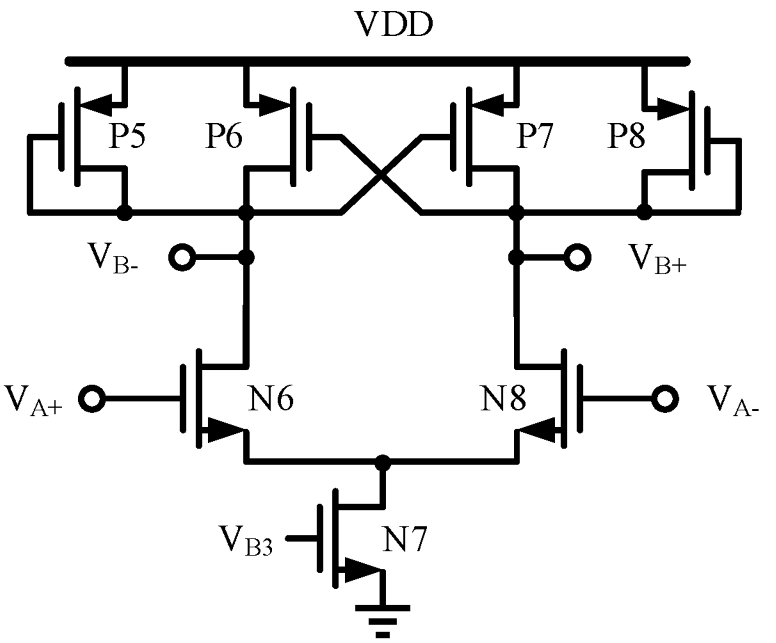
FIG. 4 shows a circuit structure diagram of a second transconductance amplification unit $g_{m2}$ according to exemplary embodiments of the present disclosure.

In exemplary embodiments of the present disclosure, as shown in FIG. 4, the second transconductance amplification unit $g_{m2}$ adopts a differential amplification structure. In exemplary embodiments, the second transconductance amplification unit $g_{m2}$ includes a fifth PMOSFET P5, a sixth PMOSFET P6, a seventh PMOSFET P7, an eighth PMOSFET P8, a sixth NMOSFET N6, a seventh NMOSFET N7, and an eighth NMOSFET N8. In exemplary embodiments, the source of the fifth PMOSFET P5 is connected to an operating voltage VDD, the gate of the fifth PMOSFET P5 is connected to the drain of the fifth PMOSFET P5, the source of the sixth PMOSFET P6 is connected to the operating voltage VDD, the gate of the sixth PMOSFET P6 is connected to the drain of the seventh PMOSFET P7, the drain of the sixth PMOSFET P6 is connected to the gate of the seventh PMOSFET P7, the drain of the sixth PMOSFET P6 is also connected to the drain of the fifth PMOSFET P5, the source of the seventh PMOSFET P7 is connected to the operating voltage VDD, the drain of the seventh PMOSFET P7 is also connected to the drain of the eighth PMOSFET P8, the source of the eighth PMOSFET P8 is connected to the operating voltage VDD, the gate of the eighth PMOSFET P8 is connected to the drain of the eighth PMOSFET P8, the drain of the sixth NMOSFET N6 is connected to the drain of the fifth PMOSFET P5, the drain of the sixth NMOSFET P6 serves as a negative differential output terminal $V_{B-}$, the gate of the sixth NMOSFET N6 serves as a positive differential input terminal $V_{A+}$, the source of the sixth NMOSFET N6 is connected to the drain of the seventh NMOSFET N7, the gate of the seventh NMOSFET N7 is connected to a third bias voltage $V_{B3}$, the source of the seventh NMOSFET N7 is connected to the ground, the drain of the seventh NMOSFET N7 is also connected to the source of the eighth NMOSFET N8, the gate of the eighth NMOSFET N8 serve as a negative differential input terminal $V_{A-}$, the drain of the eighth NMOSFET N8 is connected to the drain of the seventh PMOSFET P7, and the drain of the eighth NMOSFET N8 serves as a positive differential output terminal $V_{B+}$.

Figure 5:
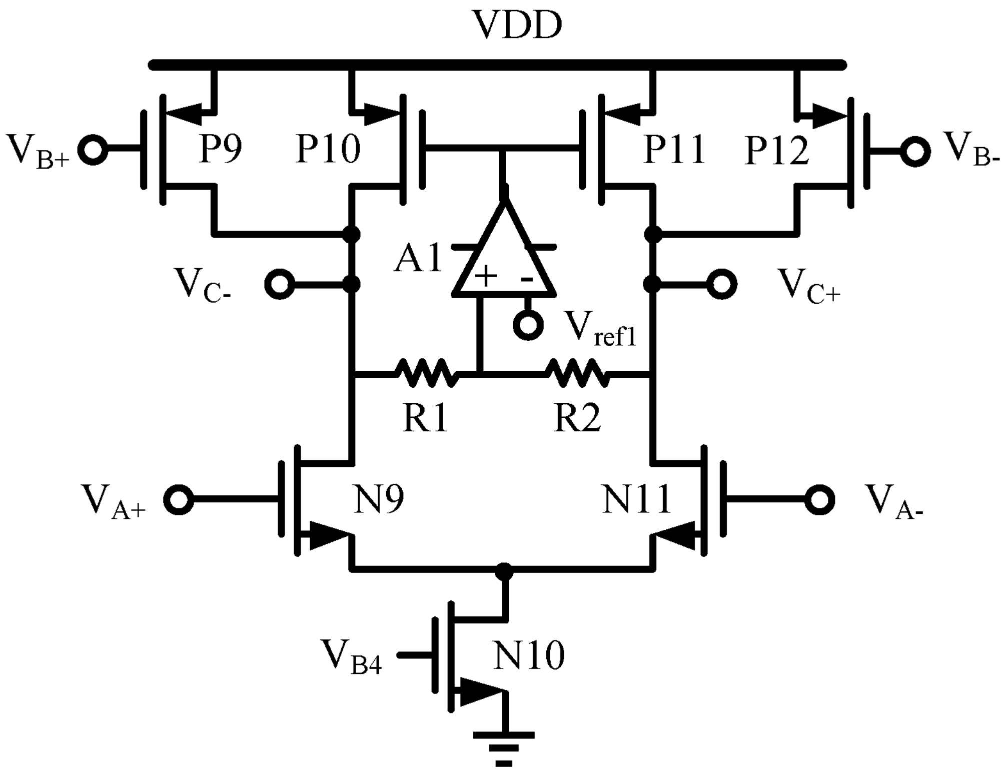
FIG. 5 shows a circuit structure diagram of a third transconductance amplification unit $g_{m5}$ according to exemplary embodiments of the present disclosure.

In exemplary embodiments of the present disclosure, as shown in FIG. 5, the third transconductance amplification unit $g_{m3}$ adopts a differential amplification structure with common mode feedback. In exemplary embodiments, the third transconductance amplification unit $g_{m3}$ includes a ninth PMOSFET P9, a tenth PMOSFET P10, an eleventh PMOSFET P11, a twelfth PMOSFET P12, a ninth NMOSFET N9, a tenth NMOSFET N10, an eleventh NMOSFET N11, a first operational amplifier A1, a first resistor R1, and a second resistor R2. In exemplary embodiments, the source of the ninth PMOSFET P9 is connected to an operating voltage VDD, the gate of the ninth PMOSFET P9 serves as a first positive differential input terminal $V_{B+}$, the drain of the ninth PMOSFET P9 is connected to the drain of the tenth PMOSFET P10, the source of the tenth PMOSFET P10 is connected to the operating voltage VDD, the gate of the tenth PMOSFET P10 is connected to the gate of the eleventh PMOSFET P11, the source of the eleventh PMOSFET P11 is connected to the operating voltage VDD, the drain of the eleventh PMOSFET P11 is connected to the drain of the twelfth PMOSFET P12, the source of the twelfth PMOSFET P12 is connected to the operating voltage VDD, the gate of the twelfth PMOSFET P12 serves as a first negative differential input terminal $V_{B-}$, the drain of the ninth NMOSFET N9 is connected to the drain of the ninth PMOSFET P9, the drain of the ninth NMOSFET N9 serves as a negative differential output terminal $V_{C-}$, the gate of the ninth NMOSFET N9 serves as a second positive differential input terminals $V_{A+}$, the source of the ninth NMOSFET N9 is connected to the drain of the tenth NMOSFET N10, the gate of the tenth NMOSFET N10 is connected to a fourth bias voltage $V_{B4}$, the source of the tenth NMOSFET N10 is connected to the ground, the drain of the tenth NMOSFET N10 is also connected to the source of the eleventh NMOSFET N11, the gate of the eleventh NMOSFET N11 serves as a second negative differential input terminal $V_{A-}$, the drain of the eleventh NMOSFET N11 is connected to the drain of the eleventh PMOSFET P11, the drain of the eleventh NMOSFET N11 serves as a positive differential output terminal $V_{C+}$, a non-inverting input terminal of the first operational amplifier A1 is connected to one end of the first resistor R1, the other end of the first resistor R1 is connected to the drain of the ninth NMOSFET N9, the non-inverting input terminal of the first operational amplifier A1 is also connected to one end of the second resistor R2, the other end of the second resistor R2 is connected to the drain of the eleventh NMOSFET N11, an inverting input terminal of the first operational amplifier A1 is connected to a first reference signal $V_{ref1}$, and an output terminal of the first operational amplifier A1 is connected to the gate of the tenth PMOSFET P10.

Figure 6:
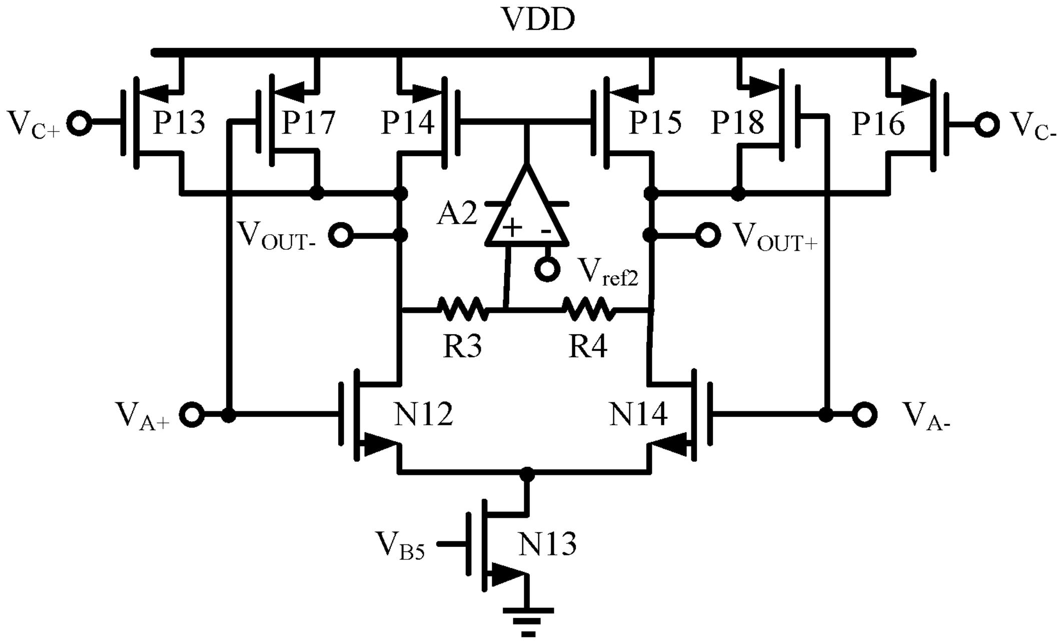
FIG. 6 shows a circuit structure diagram of a fourth transconductance amplification unit $g_{m4}$ according to exemplary embodiments of the present disclosure.

In exemplary embodiments of the present disclosure, as shown in FIG. 6, the fourth transconductance amplification unit $g_{m4}$ adopts a complementary differential amplification structure with common mode feedback. In exemplary embodiments, the fourth transconductance amplification unit $g_{m4}$ includes a thirteenth PMOSFET P13, a fourteenth PMOSFET P14, a fifteenth PMOSFET P15, a sixteenth PMOSFET P16, a seventeenth PMOSFET P17, an eighteenth PMOSFET P18, a twelfth NMOSFET N12, a thirteenth NMOSFET N13, a fourteenth NMOSFET N14, a second operational amplifier A2, a third resistor R3, and a fourth resistor R4. In exemplary embodiments, the source of the thirteenth PMOSFET P13 is connected to an operating voltage VDD, the gate of the thirteenth PMOSFET P13 serves as a first positive differential input terminal $V_{C+}$, the drain of the thirteenth PMOSFET P13 is connected to the drain of the fourteenth PMOSFET P14, the source of the fourteenth PMOSFET P14 is connected to the operating voltage VDD, the gate of the fourteenth PMOSFET P14 is connected to the gate of the fifteenth PMOSFET P15, the source of the fifteenth PMOSFET P15 is connected to the operating voltage VDD, the drain of the fifteenth PMOSFET P15 is connected to the drain of the sixteenth PMOSFET P16, the source of the sixteenth PMOSFET P16 is connected to the operating voltage VDD, the gate of the sixteenth PMOSFET P16 serves as a first negative differential input terminal $V_{C-}$, the source of the seventeenth PMOSFET P17 is connected to the operating voltage VDD, the drain of the seventeenth PMOSFET P17 is connected to the drain of the fourteenth PMOSFET P14, the source of the eighteenth PMOSFET P18 is connected to the operating voltage VDD, the drain of the eighteenth PMOSFET P18 is connected to the drain of the fifteenth PMOSFET P15, the drain of the twelfth NMOSFET N12 is connected to the drain of the fourteenth PMOSFET P14, the drain of the twelfth NMOSFET N12 serves as a negative differential output terminal $V_{OUT-}$, the gate of the twelfth NMOSFET N12 is connected to the gate of the seventeenth PMOSFET P12 and serves as a second positive differential input terminal $V_{A+}$, the source of the twelfth NMOSFET N12 is connected to the drain of the thirteenth NMOSFET N13, the gate of the thirteenth NMOSFET N13 is connected to a fifth bias Voltage $V_{B5}$, the source of the thirteenth NMOSFET N13 is connected to the ground, the drain of the thirteenth NMOSFET N13 is also connected to the source of the fourteenth NMOSFET N14, the gate of the fourteenth NMOSFET N14 is connected to the gate of the eighteenth PMOSFET P18 and serves as a second negative differential input terminal $V_{A+}$, the drain of the fourteenth NMOSFET N14 is connected to the drain of the fifteenth PMOSFET P15, the drain of the fourteenth NMOSFET N14 serves as a positive differential output terminal $V_{OUT+}$, a non-inverting input terminal of the second operational amplifier A2 is connected to one end of the third resistor R3, the other end of the third resistor R3 is connected to the drain of the twelfth NMOSFET N12, a non-inverting input terminal of the second operational amplifier A2 is also connected to one end of the fourth resistor R4, the other end of the fourth resistor R4 is connected to the drain of the fourteenth NMOSFET N14, an inverting input terminal of the second operational amplifier A2 is connected to a second reference signal $V_{ref2}$, and an output terminal of the second operational amplifier A2 is connected to the gate of the fourteenth PMOSFET P14.

Figure 7:
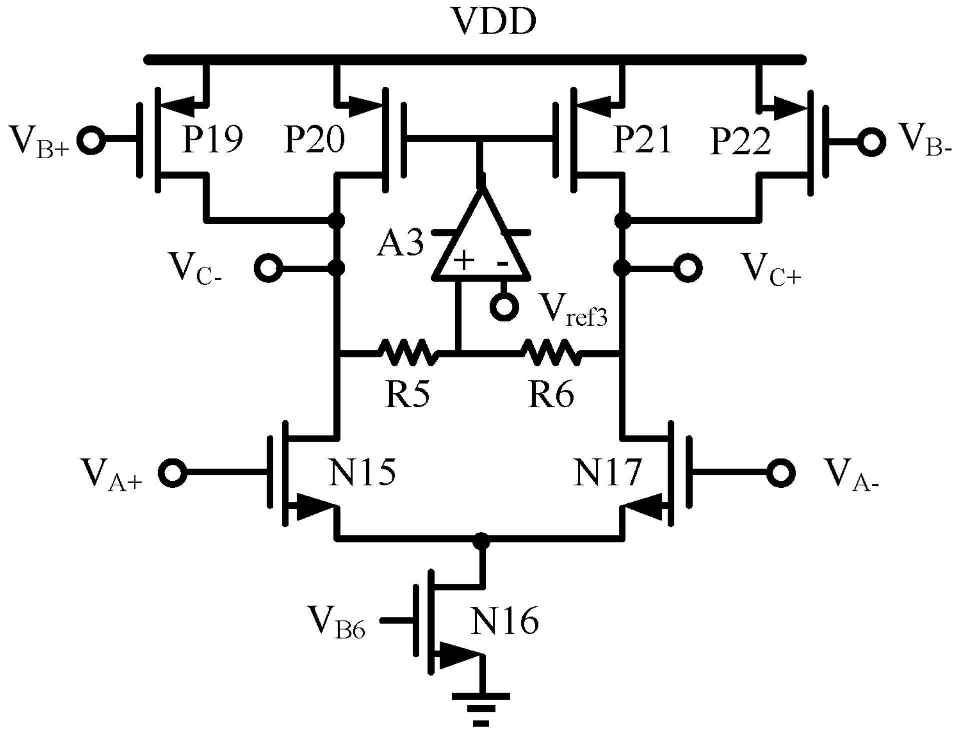
FIG. 7 shows a circuit structure diagram of a fifth transconductance amplification unit $g_{m5}$ according to exemplary embodiments of the present disclosure.

In exemplary embodiments of the present disclosure, as shown in FIG. 7, the fifth transconductance amplification unit $g_{m5}$ adopts a differential amplification structure with common mode feedback. In exemplary embodiments, the fifth transconductance amplification unit $g_{m5}$ includes a nineteenth PMOSFET P19, a twentieth PMOSFET P20, a twenty-first PMOSFET P21, a twenty-second PMOSFET P22, a fifteenth NMOSFET N15, a sixteenth NMOSFET N16, a seventeenth NMOSFET N17, a third operational amplifier A3, a fifth resistor R5, and a sixth resistor R6. In exemplary embodiments, the source of the nineteenth PMOSFET P19 is connected to an operating voltage VDD, the gate of the nineteenth PMOSFET P19 serves as a first positive differential input terminal $V_{B+}$, the drain of the nineteenth PMOSFET P19 is connected to the drain of the twentieth PMOSFET P20, the source of the twentieth PMOSFET P20 is connected to the operating voltage VDD, the gate of the twentieth PMOSFET P20 is connected to the gate of the twenty-first PMOSFET P21, the source of the twenty-first PMOSFET P21 is connected to the operating voltage VDD, the drain of the twenty-first PMOSFET P21 is connected to the drain of the twenty-second PMOSFET P22, the source of the twenty-second PMOSFET P22 is connected to the operating voltage VDD, the gate of the twenty-second PMOSFET P20 serves as a first negative differential input terminal $V_{B-}$, the drain of the fifteenth NMOSFET N15 is connected to the drain of the nineteenth PMOSFET P19, the drain of the fifteenth NMOSFET N15 serves as a negative differential output terminal $V_{C-}$, the gate of the fifteenth NMOSFET N15 serves as a second positive differential input terminal $V_{A+}$, the source of the fifteenth NMOSFET N15 is connected to the drain of the sixteenth NMOSFET N16, the gate of the sixteenth NMOSFET N16 is connected to a sixth bias voltage $V_{B6}$, the source of the sixteenth NMOSFET N16 is connected to the ground, the drain of the sixteenth NMOSFET N16 is also connected to the source of the seventeenth NMOSFET N17, the gate of the seventeenth NMOSFET N17 serves as a second negative differential input terminal $V_{A-}$, the drain of the seventeenth NMOSFET N17 is connected to the drain of the twenty-first PMOSFET P21, the drain of the seventeenth NMOSFET N17 serves as a positive differential output terminal $V_{C+}$, a non-inverting input terminal of the third operational amplifier A3 is connected to one end of the fifth resistor R5, the other end of the fifth resistor R5 is connected to the drain of the fifteenth NMOSFET N15, the non-inverting input terminal of the third operational amplifier A3 is also connected to one end of the sixth resistor R6, the other end of the sixth resistor R6 is connected to the drain of the seventeenth NMOSFET N17, an inverting input terminal of the third operational amplifier A3 is connected to a third reference signal $V_{ref3}$, and an output terminal of the third operational amplifier A3 is connected to the gate of the twentieth PMOSFET P20.

Figure 8:
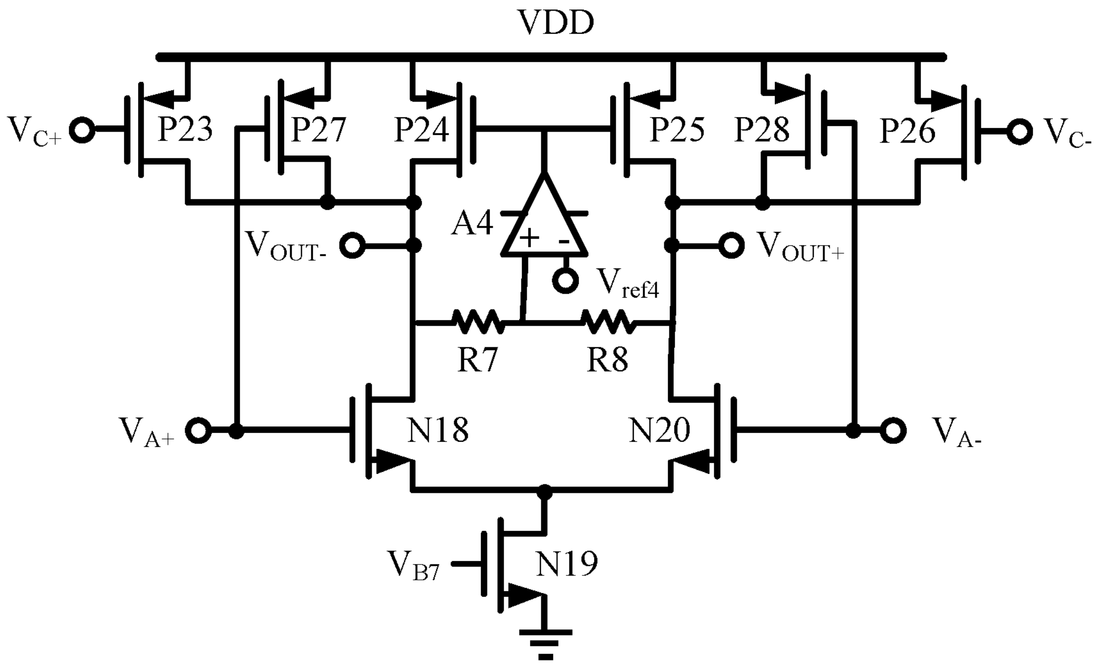
FIG. 8 shows a circuit structure diagram of a sixth transconductance amplification unit $g_{m6}$ according to exemplary embodiments of the present disclosure.

In exemplary embodiments of the present disclosure, as shown in FIG. 8, the sixth transconductance amplification unit $g_{m6}$ adopts a complementary differential amplification structure with common mode feedback. In exemplary embodiments, the sixth transconductance amplification unit $g_{m6}$ includes a twenty-third PMOSFET P23, a twenty-fourth PMOSFET P24, a twenty-fifth PMOSFET P25, a twenty-sixth PMOSFET P26, a twenty-seventh PMOSFET P27, a twenty-eighth PMOSFET P28, an eighteenth NMOSFET N18, a nineteenth NMOSFET N19, a twentieth NMOSFET N20, a fourth operational amplifier A4, a seventh resistor R7, and an eighth resistor R8. In exemplary embodiments, the source of the twenty-third PMOSFET P23 is connected to an operating voltage VDD, the gate of twenty-third PMOSFET P23 serves as a first positive differential input terminal $V_{C+}$, the drain of the twenty-third PMOSFET P23 is connected to the drain of the twenty-fourth PMOSFET P24, the source of the twenty-fourth PMOSFET P24 is connected to the operating voltage VDD, the gate of the twenty-fourth PMOSFET P24 is connected to the gate of the twenty-fifth PMOSFET P25, the source of the twenty-fifth PMOSFET P25 is connected to the operating voltage VDD, the drain of the twenty-fifth PMOSFET P25 is connected to the drain of the twenty-sixth PMOSFET P26, the source of the twenty-sixth PMOSFET P26 is connected to the operating voltage VDD, the gate of the twenty-sixth PMOSFET P26 serves as a first negative differential input terminal $V_{C-}$, the source of the twenty-seventh PMOSFET P27 is connected to the operating voltage VDD, the drain of the twenty-seventh PMOSFET P27 is connected to the drain of the twenty-fourth PMOSFET P24, the source of the twenty-eighth PMOSFET P28 is connected to the operating voltage VDD, the drain of the twenty-eighth PMOSFET P28 is connected to the drain of the twenty-fifth PMOSFET P25, the drain of the eighteenth NMOSFET N18 is connected to the drain of the twenty-fourth PMOSFET P24, the drain of the eighteenth NMOSFET N18 serves as a negative differential output terminal $V_{OUT-}$, the gate of the eighteenth NMOSFET N18 is connected to the gate of the twenty-seventh PMOSFET P27 and serves as a second positive differential input terminal $V_{A+}$, the source of the eighteenth NMOSFET N18 is connected to the drain of the nineteenth NMOSFET N19, the gate of the nineteenth NMOSFET N19 is connected to a seventh bias voltage $V_{B7}$, the source of the nineteenth NMOSFET N19 is connected to the ground, the drain of the nineteenth NMOSFET N19 is also connected to the source of the twentieth NMOSFET N20, the gate of the twentieth NMOSFET N20 is connected to the gate of the twenty-eighth PMOSFET P28 and serves as a second negative differential input terminal $V_{A-}$, the drain of the twentieth NMOSFET N20 is connected to the drain of the twenty-fifth PMOSFET P25, the drain of the twentieth NMOSFET N20 serves as a positive differential output terminal $V_{OUT+}$, a non-inverting input terminal of the fourth operational amplifier A4 is connected to one end of the seventh resistor R7, the other end of the seventh resistor R7 is connected to the drain of the eighteenth NMOSFET N18, the non-inverting input terminal of the fourth operational amplifier A4 is also connected to one end of the eighth resistor R8, the other end of the eighth resistor R8 is connected to the drain of the twentieth NMOSFET N20, an inverting input terminal of the fourth operational amplifier A4 is connected to a fourth reference signal $V_{ref4}$, and an output terminal of the fourth operational amplifier A4 is connected to the gate of the twenty-fourth PMOSFET P24.

Figure 9:
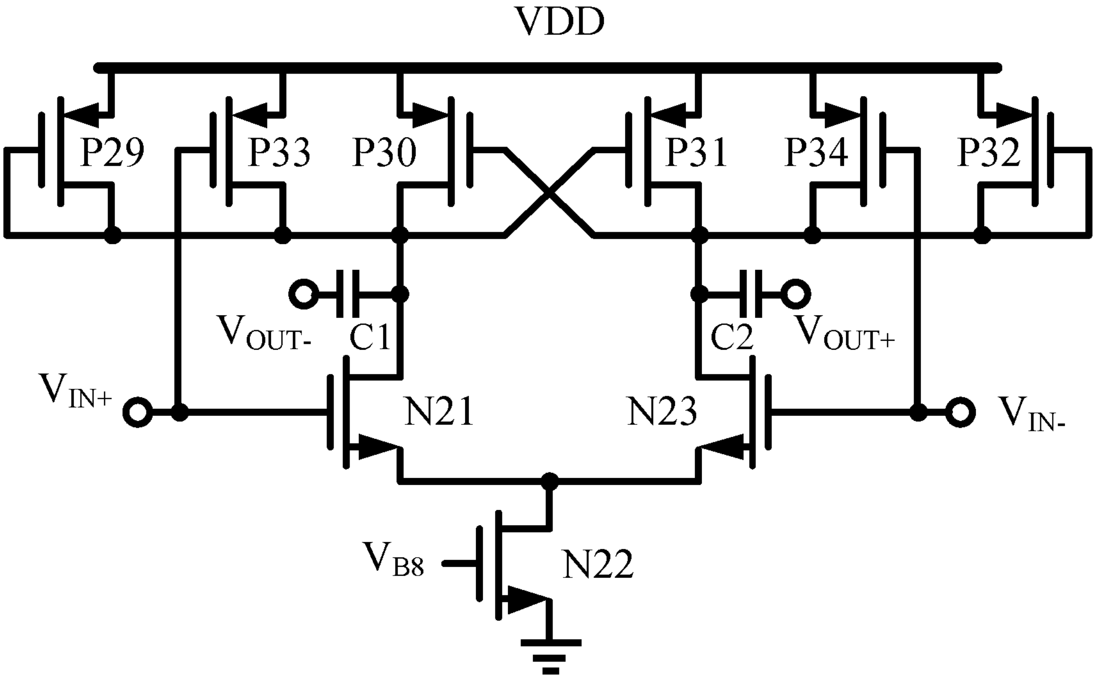
FIG. 9 shows a circuit structure diagram of a seventh transconductance amplification unit $g_{m7}$ according to exemplary embodiments of the present disclosure.

In exemplary embodiments of the present disclosure, as shown in FIG. 9, the seventh transconductance amplification unit $g_{m7}$ adopts a complementary differential amplification structure. In exemplary embodiments, the seventh transconductance amplification unit $g_{m7}$ includes a twenty-ninth PMOSFET P29, a thirtieth PMOSFET P30, a thirty-first PMOSFET P31, a thirty-second PMOSFET P32, a thirty-third PMOSFET P33, a thirty-fourth PMOSFET P34, a twenty-first NMOSFET N21, a twenty-second NMOSFET N22, a twenty-third NMOSFET N23, a first capacitor C1, and a second capacitor C2. In exemplary embodiments, the source of the twenty-ninth PMOSFET P29 is connected to an operating voltage VDD, the gate of the twenty-ninth PMOSFET P29 is connected to the drain of the twenty-ninth PMOSFET P29, the drain of the twenty-ninth PMOSFET P29 is connected to the drain of the thirtieth PMOSFET P30, the source of the thirtieth PMOSFET P30 is connected to the operating voltage VDD, the gate of the thirtieth PMOSFET P30 is connected to the drain of the thirty-first PMOSFET P31, the source of the thirty-first PMOSFET P31 is connected to the operating voltage VDD, the gate of the thirty-first PMOSFET P31 is connected to the drain of the thirtieth PMOSFET P30, the drain of the thirty-first PMOSFET P31 is connected to the drain of the thirty-second PMOSFET P32, the source of the thirty-second PMOSFET P32 is connected to the operating voltage VDD, the gate of the thirty-second PMOSFET P32 is connected to the drain of the thirty-second PMOSFET P32, the source of the thirty-third PMOSFET P33 is connected to the operating voltage VDD, the drain of the thirty-third PMOSFET P33 is connected to the drain of the thirtieth PMOSFET P30, the source of the thirty-fourth PMOSFET P34 is connected to the operating voltage VDD, the drain of the thirty-fourth PMOSFET P34 is connected to the drain of the thirty-first PMOSFET P31, the drain of the twenty-first NMOSFET N21 is connected to the drain of the thirtieth PMOSFET P30, the drain of the twenty-first NMOSFET N21 is connected to one end of the first capacitor C1, the other end of the first capacitor C1 serves as a negative differential output terminal $V_{OUT-}$, the gate of the twenty-first NMOSFET N21 is connected to the gate of the thirty-third PMOSFET P33 and serves as a positive differential input terminal $V_{IN+}$, the source of the twenty-first NMOSFET N21 is connected to the drain of the twenty-second NMOSFET N22, the gate of the twenty-second NMOSFET N22 is connected to an eighth bias voltage $V_{B8}$, the source of the twenty-second NMOSFET N22 is connected to the ground, the drain of the twenty-second NMOSFET N22 is also connected to the source of the twenty-third NMOSFET N23, the gate of the twenty-third NMOSFET N23 is connected to the gate of the thirty-fourth PMOSFET P34 and serves as a negative differential input terminal $V_{IN-}$, the drain of the twenty-third NMOSFET N23 is connected to the drain of the thirty-first PMOSFET P33, and the drain of the twenty-third NMOSFET N23 is connected to one end of the second capacitor C2, and the other end of the second capacitor C2 serves as a positive differential output terminal $V_{OUT+}$.

In exemplary embodiments, after operations S2, S4, S6, S8, and S10 are executed, a fourth-order feedforward compensation operational amplifier as shown in FIG. 2 or FIG. 10 is obtained. In exemplary embodiments, the first transconductance amplification unit $g_{m1}$, the second transconductance amplification unit $g_{m2}$, the third transconductance amplification unit $g_{m3}$, and the fourth transconductance amplification unit $g_{m4}$ form a fourth-order operational amplifier path, which is the main amplification path. In exemplary embodiments, the remaining fifth transconductance amplification unit $g_{m5}$, the sixth transconductance amplification unit $g_{m6}$, and the seventh transconductance amplification unit $g_{m7}$ are three feedforward stages. In exemplary embodiments, the first transconductance amplification unit $g_{m1}$, the fifth transconductance amplification unit $g_{m5}$, and the fourth transconductance amplification unit $g_{m4}$ form a third-order operational amplifier path. In exemplary embodiments, the first transconductance amplification unit $g_{m1}$, and the sixth transconductance amplifier unit $g_{m6}$ form a second-order operational amplifier path. In exemplary embodiments, the seventh transconductance amplifier unit $g_{m7}$ forms a first-order operational amplifier path. In exemplary embodiments, the first-order operational amplifier path performs feedforward compensation on the second-order operational amplifier path, the second-order operational amplifier path performs feedforward compensation on the third-order operational amplifier path, and the third-order operational amplifier path performs feedforward compensation on the fourth-order operational amplifier path.

In exemplary embodiments, as shown in FIG. 10, due to process characteristics, parasitic capacitance inevitably exists in the connection nodes between the transconductance amplification units of the fourth-order feedforward compensation operational amplifier. Also, due to multi-stage cascading, the influence of the output impedance of the corresponding node should be considered. Since the main parameters that determine the transfer function of an operational amplifier include gain, pole(s), and zero(s), the transfer function of a high-order multi-channel feedforward compensation operational amplifier may be obtained by solving these three parameters in sequence.

First of all, it can be seen from FIG. 2 and FIG. 10 that the highest-order path of a fourth-order feedforward compensation operational amplifier is a fourth-order operational amplifier path formed by a transconductance amplification unit $g_{m1}$, a second transconductance amplification unit $g_{m2}$, a third transconductance amplification unit $g_{m3}$, and a fourth transconductance amplifier unit $g_{m4}$, and the gain of the operational amplifier increases with the increase of the cascade order. Therefore, the direct current (DC) gain of a fourth-order feedforward compensation operational amplifier is approximately equal to the DC gain of its fourth-order operational amplifier path. That is, $$A_0 \approx A_1 A_2 A_3 A_4, \tag{1}$$

where $A_0$ is the gain of this fourth-order feedforward compensation operational amplifier, and $A_1$ to $A_4$ are the gains of the first transconductance amplification unit $g_{m1}$, the second transconductance amplification unit $g_{m2}$, the third transconductance amplification unit $g_{m3}$, and the fourth transconductance amplification unit $g_{m4}$, respectively.

Secondly, since there is only a feedforward branch in the fourth-order feedforward operational amplifier and there is no feedback branch, the pole(s) of its transfer function are determined by its various nodes. That is, $$\omega_{Pi} = \frac{1}{r_i C_i}, \ (i = 1, 2, 3, 4) \tag{2}$$

where capacitances $C_1$ to $C_3$ are the parasitic capacitances of nodes A, B, and C, respectively, capacitance $C_4$ is the sum of the parasitic capacitance of the output node and the load capacitance of the operational amplifier, and resistances $r_1$ to $r_3$ are the output impedances of nodes A, B, and C, respectively, and resistance $r_4$ is the parallel impedance of the output impedance of the output node and the load impedance.

Finally, for the simplest second-order feedforward compensation operational amplifier, as shown in FIG. 11, its main circuit includes a transconductance amplification unit $g_{ma}$ and a transconductance amplification unit $g_{mb}$, the feedforward branch includes a transconductance amplification unit $g_{mc}$, capacitances $C_a$ to $C_b$ are the parasitic capacitance of the nodes, respectively, and resistances $r_a$ to $r_b$ are the output impedances of the nodes, respectively. The transfer function of this feedforward operational amplifier system has a zero point and is expressed as:

$$\omega_Z = \frac{G_{mb}}{G_{mc}}\frac{G_{ma}}{C_a}, \tag{3}$$

where $\omega_Z$ is a frequency zero point, $G_{ma}$ to $G_{mc}$ are the transconductance values of the transconductance amplification unit $g_{ma}$ to $g_{mc}$, respectively.

In the fourth-order feedforward compensated operational amplifier shown in FIG. 2 or FIG. 10, the fourth-order operational amplifier path is compensated by the third-order operational amplifier path, the third-order operational amplifier path is compensated by the second-order operational amplifier path, and the second-order operational amplifier path is compensated by the first-order operational amplifier path. In this way, after three times of compensation, the operational amplifier will generate three zero points.

For the zero point generated by the fourth-order operational amplifier path and the third-order operational amplifier path, since the first transconductance amplification unit $g_{m1}$ and the second transconductance amplification unit $g_{m2}$ are shared by these two paths, the zero point generated by these two paths are equal to the zero point generated by the second transconductance amplification unit $g_{m2}$, the third transconductance amplification unit $g_{m3}$, and the fifth transconductance amplification unit $g_{m5}$. The zero point is obtained by using the equation (3):

$$\omega_{Z1} = \frac{G_{m3}}{G_{m5}}\frac{G_{m2}}{C_2}, \tag{4}$$

where $\omega_{Z1}$ is the first frequency zero point, $G_{m2}$ is the transconductance value of the second transconductance amplification unit $g_{m2}$, $G_{m3}$ is the transconductance value of the third transconductance amplification unit $g_{m3}$, and $G_{m5}$ is the transconductance value of the fifth transconductance amplification unit $g_{m5}$.

In the same way, for the zero point generated by the third-order operational amplifier path and the second-order operational amplifier path, using the same method as applied to $\omega_{Z1}$ for solution, the zero point is related to the fourth transconductance amplification unit $g_{m4}$, the fifth transconductance amplification unit $g_{m5}$, and the sixth transconductance amplification unit $g_{m6}$. The zero point is expressed as:

$$\omega_{Z2} = \frac{G_{m4}}{G_{m6}}\frac{G_{m5}}{C_3}, \tag{5}$$

where $\omega_{Z2}$ is the second frequency zero point, $G_{m4}$ is the transconductance value of the fourth transconductance amplification unit $g_{m4}$, and $G_{m6}$ is the transconductance value of the sixth transconductance amplification unit $g_{m6}$.

In the same way, for the zero point generated by the second-order operational amplifier path and the first-order operational amplifier path, using the same method as applied to $\omega_{Z1}$ for solution, the zero point is equal to the zero point generated by the first transconductance amplification unit $g_{m1}$, the sixth transconductance amplification unit $g_{m6}$, and the seventh transconductance amplification unit $g_{m7}$. The zero point is obtained by using the equation (3):

$$\omega_{Z3} = \frac{G_{m6}}{G_{m7}}\frac{G_{m1}}{C_1}, \tag{6}$$

where $\omega_{Z3}$ is the third frequency zero point, $G_{m1}$ is the transconductance value of the first transconductance amplification unit $g_{m1}$, and $G_{m7}$ is the transconductance value of the seventh transconductance amplification unit $g_{m7}$.

It should be noted that the three zero points represented by equations (4)-(6) above ignore the zero point under the other two operational amplifier paths of the feedforward operational amplifier and are not real zero points of the transfer function of the entire fourth-order feedforward operational amplifier system. According to equations (1)-(2) and (4)-(6), the overall system transfer function of the fourth-order feedforward operational amplifier is obtained as below:

$$\begin{aligned} H(s) &\approx \frac{A_0\left\{1+\frac{s}{\omega_{Z1}}\left[1+\frac{s}{\omega_{Z2}}\left(1+\frac{s}{\omega_{Z3}}\right)\right]\right\}}{\left(1+\frac{s}{\omega_{P1}}\right)\left(1+\frac{s}{\omega_{P2}}\right)\left(1+\frac{s}{\omega_{P3}}\right)\left(1+\frac{s}{\omega_{P4}}\right)} \\ &= \frac{A_0\left(1+\frac{s}{\omega_{Z1}}+\frac{s^2}{\omega_{Z1}\omega_{Z2}}+\frac{s^3}{\omega_{Z1}\omega_{Z2}\omega_{Z3}}\right)}{\left(1+\frac{s}{\omega_{P1}}\right)\left(1+\frac{s}{\omega_{P2}}\right)\left(1+\frac{s}{\omega_{P3}}\right)\left(1+\frac{s}{\omega_{P4}}\right)}. \end{aligned} \tag{7}$$

Finally, by constraining the transconductance of each stage in the fourth-order feedforward compensation operational amplifier, the gain and stability requirements may be met. The constraint relationship adopted in exemplary embodiments of the present disclosure is as follows:

$$\begin{cases} \frac{G_{m5}}{G_{m2}} = \frac{G_{m1}}{G_{m2}} \approx 3 \\ k = \frac{G_{m5}}{G_{m3}} = \frac{G_{m6}}{G_{m4}} = \frac{G_{m7}}{G_{m6}} \approx 3 \end{cases}. \tag{8}$$

Therefore, the present disclosure proposes a method that does not require complicated mathematical derivation and calculation but obtains the system transfer function of a high-order multi-channel feedforward operational amplifier through an intuitive understanding of its system structure, and the fourth-order feedforward compensation operational amplifier of the present disclosure is designed and implemented based on a 65 nm CMOS process. In addition, the fourth-order feedforward compensation operational amplifier circuit stage implementation utilizes amplifier performance optimization technologies such as current multiplexing technology, cascode structure, parallel structures of a pair of diode-connected transistors and a pair of cross-coupled transistors having the same size, and complementary differential class-AB working mode, and so on.

In exemplary embodiments, in order to improve the performance of the operational amplifier, various optimization techniques are adopted. In exemplary embodiments, the first NMOSFET N1 and the second NMOSFET N2 in the first transconductance amplification unit $g_{m1}$ adopt a cascode structure to achieve high gain to reduce the noise contribution of the subsequent stage. In exemplary embodiments, the first transconductance amplification unit $g_{m1}$, the second transconductance amplification unit $g_{m2}$, and the seventh transconductance amplification unit $g_{m7}$ use pairs of diode-connected PMOSFET and cross-coupled PMOSFET that have the same size to achieve a high gain and a certain output DC voltage at the same time. However, in order to ensure sufficient output voltage swing of the operational amplifier, such technology is not applied to the third transconductance amplification unit $g_{m3}$, the fourth transconductance amplification unit $g_{m4}$, and the fifth transconductance amplification unit $g_{m5}$, and the sixth transconductance amplification unit $g_{m6}$. In exemplary embodiments, it can be seen from equation (8) that the transconductance of the feedforward branch of the operational amplifier is relatively large, so the third transconductance amplification unit $g_{m3}$ and the fourth transconductance amplification unit $g_{m4}$ can be implemented with a differential pair of PMOSFETs, while the fifth transconductance amplification unit $g_{m5}$, the sixth transconductance amplification unit $g_{m6}$, and the seventh transconductance amplification unit $g_{m7}$ of the feedforward branch must adopt a differential pair of NMOSFETs with higher carrier mobility. In exemplary embodiments, current multiplexing technology is used in the fourth transconductance amplification unit $g_{m4}$, the sixth transconductance amplification unit $g_{m6}$, and the seventh transconductance amplification unit $g_{m7}$ to reduce power consumption. In exemplary embodiments, since the output stage has the highest transconductance in the fourth transconductance amplification unit $g_{m4}$, the sixth transconductance amplification unit $g_{m6}$, and the seventh transconductance amplification unit $g_{m7}$, these two stages of operational amplifiers use complementary differential class-AB working mode.

Figure 12:
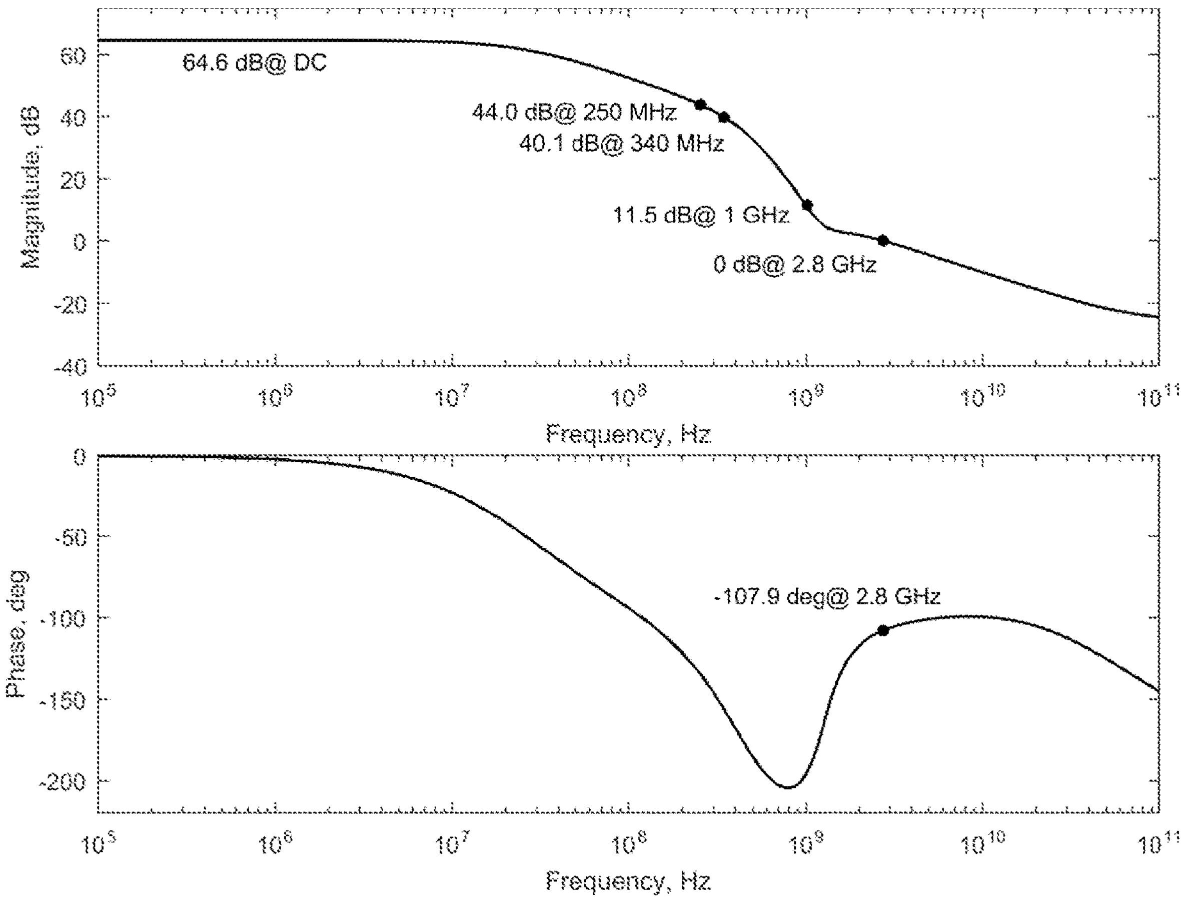
FIG. 12 shows a schematic diagram of an amplitude-frequency response curve and a phase-frequency response curve of a fourth-order feedforward compensation operational amplifier according to exemplary embodiments of the present disclosure.
Figure 13:
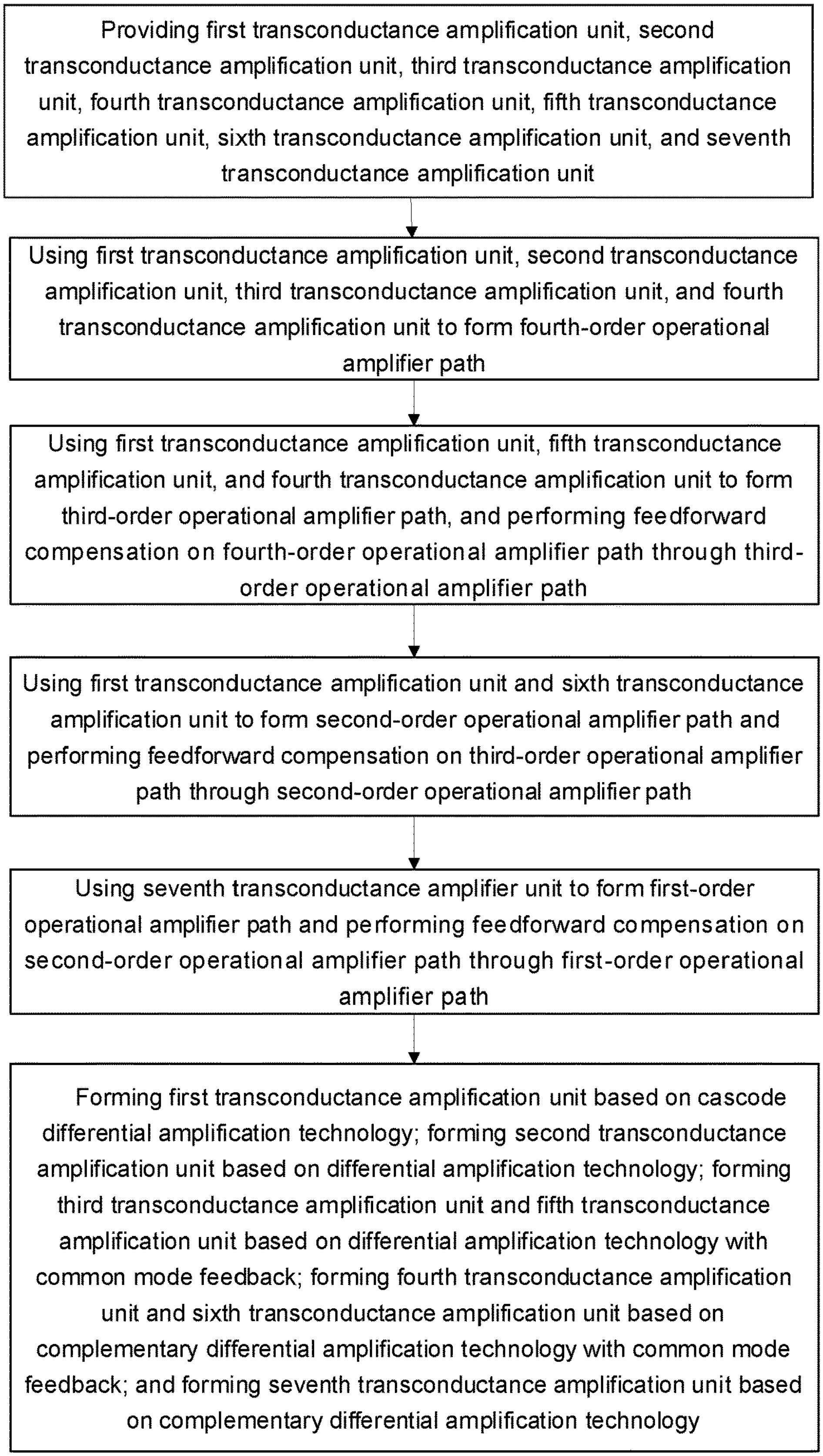
FIG. 13 shows another flow chart of operations of a method for designing a fourth-order feedforward compensation operational amplifier according to exemplary embodiments of the present disclosure.

In exemplary embodiments of the present disclosure, a corresponding fourth-order feedforward compensation operational amplifier is designed based on the 65 nm CMOS process, and its amplitude-frequency response and phase-frequency response curves when driving a 400 fF capacitive load are as shown in FIG. 12. As shown in FIG. 12, the horizontal axes are both labeled as "Frequency" whose corresponding unit is Hertz (Hz), the vertical axes refer to "Magnitude" and "Phase", respectively, and their corresponding units are decibel (dB) and degree (deg), respectively. As can be seen from FIG. 12, the gains of the amplifier at DC phase, 250 MHZ, 340 MHz, and 1 GHz are 64.6 dB, 44.0 dB, 40.1 dB, and 11.5 dB, respectively, and the phase margin and the power consumption of the amplifier are 72.1° and 12.96 mW, respectively. Therefore, the fourth-order feedforward compensation operational amplifier proposed by the present disclosure may meet the gain requirements of the operational amplifier in the continuous-time bandpass sigma-delta modulator with an intermediate frequency of up to 340 MHz and a sampling frequency of up to 2 GHz.

To sum up, in the fourth-order feedforward compensation operational amplifier and its design method provided by the present disclosure, based on the structural design of "mainly the fourth-order operational amplifier path", the highest-order path is the fourth-order operational amplifier path. The gain of an operational amplifier increases as the cascade order increases, and its DC gain can be approximately equal to the DC gain of its fourth-order operational amplifier path. Based on the structural design where "the one with a lower order in adjacent two orders of operational amplifier paths performs feedforward compensation on the one with a higher order", the zero point generated by the operational amplifier paths with adjacent two orders is equal to the zero point of the equivalent second-order feedforward operational amplifier excluding the common part, so it is easy to obtain three zero points corresponding to the transfer function according to this structure design. The fourth-order feedforward compensation operational amplifier only has a feedforward branch and no feedback branch, so the poles of its transfer function are determined by each node. According to the parasitic capacitance and the output impedance of each node, the corresponding poles may be obtained. According to the obtained DC gains, three zero points, and four poles, the transfer function of the fourth-order feedforward compensation operational amplifier may be obtained. Based on the circuit structure design of the fourth-order feedforward compensation operational amplifier, it is easy to obtain its transfer function. In addition, based on the obtained transfer function and the gain requirements of the continuous-time bandpass sigma-delta modulator, the transconductance constraint relationship between each transconductance amplification unit in the fourth-order feedforward compensation operational amplifier may be deduced inversely. The fourth-order feedforward compensation operational amplifier formed by selecting and designing each transconductance amplification unit based on the corresponding transconductance constraint relationship may effectively satisfy the usage requirements of the continuous-time bandpass sigma-delta modulator.

As mentioned above, the fourth-order feedforward compensation operational amplifier and the method for designing the same according to exemplary embodiments of the present disclosure may have at least the following beneficial effects.

The highest-order path of the fourth-order feedforward compensation operational amplifier is the fourth-order operational amplifier path, and the gain of the operational amplifier increases with the increase of the cascade order. The DC gain of the fourth-order feedforward compensation operational amplifier may be approximately equal to the DC gain of its fourth-order operational amplifier path. Based on the structure design where "the first-order operational amplifier path performs feedforward compensation on the second-order operational amplifier path, the second-order operational amplifier path performs feedforward compensation on the third-order operational amplifier path, and the third-order operational amplifier path performs feedforward compensation on the fourth-order operational amplifier path", the zero point generated by the operational amplifier paths with adjacent two orders is equal to the zero point of the equivalent second-order feedforward operational amplifier except the common part, so the three zero points of the corresponding transfer function may be easily obtained according to this structure design. The fourth-order feedforward compensation operational amplifier only has a feedforward branch and no feedback branch, so the poles of its transfer function are determined by each node, and the corresponding poles may be obtained according to the parasitic capacitance and the output impedance of each node. According to the obtained DC gain, three zero points, and four poles, the transfer function of the fourth-order feedforward compensation operational amplifier may be obtained. Based on the circuit structure design of the fourth-order feedforward compensation operational amplifier, its transfer function may be easily obtained. In addition, based on the obtained transfer function and the gain requirements of the continuous-time bandpass sigma-delta modulator, the transconductance constraint relationship between each transconductance amplification unit in the fourth-order feedforward compensation operational amplifier may be deduced inversely. The fourth-order feedforward compensation operational amplifier formed by selecting and designing each transconductance amplification unit based on the corresponding transconductance constraint relationship may effectively satisfy the usage requirements of the continuous-time bandpass sigma-delta modulator.

The above embodiments only illustrate the principles and effects of the present disclosure, but are not intended to limit the present disclosure. Anyone familiar with this technology can modify or change the above embodiments without departing from the scope of the present disclosure. Therefore, all equivalent modifications or changes made by those with ordinary knowledge in the technical field without departing from technical ideas disclosed in the present disclosure shall still be covered by the claims of the present disclosure.

What is claimed is:

1. A fourth-order feedforward compensation operational amplifier, comprising: a first transconductance amplification unit, a second transconductance amplification unit, a third transconductance amplification unit, a fourth transconductance amplification unit, a fifth transconductance amplification unit, a sixth transconductance amplification unit, and a seventh transconductance amplification unit, wherein the first transconductance amplification unit, the second transconductance amplification unit, the third transconductance amplification unit, and the fourth transconductance amplification unit are cascaded in sequence, and the first transconductance amplification unit, the second transconductance amplification unit, the third transconductance amplification unit, and the fourth transconductance amplification unit form a fourth-order operational amplifier path, an input terminal of the fifth transconductance amplification unit is connected to an output terminal of the first transconductance amplification unit, an output terminal of the fifth transconductance amplification unit is connected to an input terminal of the fourth transconductance amplification unit, and the first transconductance amplification unit, the fifth transconductance amplification unit, and the fourth transconductance amplification unit form a third-order operational amplifier path, an input terminal of the sixth transconductance amplification unit is connected to the output terminal of the first transconductance amplification unit, and an output terminal of the sixth transconductance amplification unit is connected to an output terminal of the fourth transconductance amplification unit, and the first transconductance amplification unit and the sixth transconductance amplification unit form a second-order operational amplifier path, an input terminal of the seventh transconductance amplification unit is connected to an input terminal of the first transconductance amplification unit, and an output terminal of the seventh transconductance amplification unit is connected to the output terminal of the fourth transconductance amplification unit, and the seventh transconductance amplification unit forms a first-order operational amplifier path, and the first-order operational amplifier path is configured to perform feedforward compensation on the second-order operational amplifier path, the second-order operational amplifier path is configured to perform feedforward compensation on the third-order operational amplifier path, and the third-order operational amplifier path is configured to perform feedforward compensation on the fourth-order operational amplifier path.

2. The fourth-order feedforward compensation operational amplifier according to claim 1, wherein the first transconductance amplification unit adopts a cascode differential amplification structure, the first transconductance amplification unit includes a first PMOSFET, a second PMOSFET, a third PMOSFET, a fourth PMOSFET, a first NMOSFET, a second NMOSFET, a third NMOSFET, a fourth NMOSFET, and fifth NMOSFET, and a source of the first PMOSFET is connected to an operating voltage VDD, a gate of the first PMOSFET is connected to a drain of the first PMOSFET, a source of the second PMOSFET is connected to the operating voltage, a gate of the second PMOSFET is connected to a drain of the third PMOSFET, a drain of the second PMOSFET is connected to a gate of the third PMOSFET, the drain of the second PMOSFET is connected to the drain of the first PMOSFET, a source of the third PMOSFET is connected to the operating voltage, the drain of the third PMOSFET is also connected to a drain of the fourth PMOSFET, a source of the fourth PMOSFET is connected to the operating voltage, a gate of the fourth PMOSFET is connected to the drain of the fourth PMOSFET, a drain of the first NMOSFET is connected to the drain of the first PMOSFET, the drain of the first NMOSFET serves as a negative differential output terminal, a gate of the first NMOSFET is connected to a first bias voltage, a source of the first NMOSFET is connected to a drain of the second NMOSFET, a gate of the second NMOSFET serves as a positive differential input terminal, a source of the second NMOSFET is connected to a drain of the third NMOSFET, a gate of the third NMOSFET is connected to a second bias voltage, a source of the third NMOSFET is connected to ground, a drain of the third NMOSFET is also connected to a source of the fourth NMOSFET, a gate of the fourth NMOSFET serves as a negative differential input terminal, a drain of the fourth NMOSFET is connected to a source of the fifth NMOSFET, a gate of the fifth NMOSFET is connected to the first bias voltage, a drain of the fifth NMOSFET is connected to the drain of the third PMOSFET, and the drain of the fifth NMOSFET serves as a positive differential output terminal.

3. The fourth-order feedforward compensation operational amplifier according to claim 2, wherein the second transconductance amplification unit adopts a differential amplification structure, the second transconductance amplification unit includes a fifth PMOSFET, a sixth PMOSFET, a seventh PMOSFET, an eighth PMOSFET, a sixth NMOSFET, a seventh NMOSFET, and an eighth NMOSFET, and a source of the fifth PMOSFET is connected to the operating voltage, a gate of the fifth PMOSFET is connected to a drain of the fifth PMOSFET, a source of the sixth PMOSFET is connected to the operating voltage, a gate of the sixth PMOSFET is connected to a drain of the seventh PMOSFET, a drain of the sixth PMOSFET is connected to a gate of the seventh PMOSFET, the drain of the sixth PMOSFET is also connected to the drain of the fifth PMOSFET, a source of the seventh PMOSFET is connected to the operating voltage, the drain of the seventh PMOSFET is also connected to a drain of the eighth PMOSFET, a source of the eighth PMOSFET is connected to the operating voltage, a gate of the eighth PMOSFET is connected to the drain of the eighth PMOSFET, a drain of the sixth NMOSFET is connected to the drain of the fifth PMOSFET, the drain of the sixth NMOSFET serves as a negative differential output terminal, a gate of the sixth NMOSFET serves as a positive differential input terminal, a source of the sixth NMOSFET is connected to a drain of the seventh NMOSFET, a gate of the seventh NMOSFET is connected to a third bias voltage, a source of the seventh NMOSFET is connected to the ground, the drain of the seventh NMOSFET is also connected to a source of the eighth NMOSFET, a gate of the eighth NMOSFET serve as a negative differential input terminal, a drain of the eighth NMOSFET is connected to the drain of the seventh PMOSFET, and the drain of the eighth NMOSFET serves as a positive differential output terminal.

4. The fourth-order feedforward compensation operational amplifier according to claim 3, wherein the third transconductance amplification unit adopts a differential amplification structure with common mode feedback, the third transconductance amplification unit includes a ninth PMOSFET, a tenth PMOSFET, an eleventh PMOSFET, a twelfth PMOSFET, a ninth NMOSFET, a tenth NMOSFET, an eleventh NMOSFET, a first operational amplifier, a first resistor, and a second resistor, and a source of the ninth PMOSFET is connected to the operating voltage, a gate of the ninth PMOSFET serves as a first positive differential input terminal, a drain of the ninth PMOSFET is connected to a drain of the tenth PMOSFET, a source of the tenth PMOSFET is connected to the operating voltage, a gate of the tenth PMOSFET is connected to a gate of the eleventh PMOSFET, a source of the eleventh PMOSFET is connected to the operating voltage, a drain of the eleventh PMOSFET is connected to a drain of the twelfth PMOSFET, a source of the twelfth PMOSFET is connected to the operating voltage, a gate of the twelfth PMOSFET serves as a first negative differential input terminal, a drain of the ninth NMOSFET is connected to the drain of the ninth PMOSFET, the drain of the ninth NMOSFET serves as a negative differential output terminal, a gate of the ninth NMOSFET serves as a second positive differential input terminals, a source of the ninth NMOSFET is connected to a drain of the tenth NMOSFET, a gate of the tenth NMOSFET is connected to a fourth bias voltage, a source of the tenth NMOSFET is connected to the ground, the drain of the tenth NMOSFET is also connected to a source of the eleventh NMOSFET, a gate of the eleventh NMOSFET serves as a second negative differential input terminal, a drain of the eleventh NMOSFET is connected to the drain of the eleventh PMOSFET, the drain of the eleventh NMOSFET serves as a positive differential output terminal, a non-inverting input terminal of the first operational amplifier is connected to a first end of the first resistor, a second end of the first resistor is connected to the drain of the ninth NMOSFET, the non-inverting input terminal of the first operational amplifier is also connected to a first end of the second resistor, a second end of the second resistor is connected to the drain of the eleventh NMOSFET, an inverting input terminal of the first operational amplifier is connected to a first reference signal, and an output terminal of the first operational amplifier is connected to the gate of the tenth PMOSFET.

5. The fourth-order feedforward compensation operational amplifier according to claim 4, wherein the fourth transconductance amplification unit adopts a complementary differential amplification structure with common mode feedback, the fourth transconductance amplification unit includes a thirteenth PMOSFET, a fourteenth PMOSFET, a fifteenth PMOSFET, a sixteenth PMOSFET, a seventeenth PMOSFET, an eighteenth PMOSFET, a twelfth NMOSFET, a thirteenth NMOSFET, a fourteenth NMOSFET, a second operational amplifier, a third resistor, and a fourth resistor, and a source of the thirteenth PMOSFET is connected to the operating voltage, a gate of the thirteenth PMOSFET serves as a first positive differential input terminal, a drain of the thirteenth PMOSFET is connected to a drain of the fourteenth PMOSFET, a source of the fourteenth PMOSFET is connected to the operating voltage, a gate of the fourteenth PMOSFET is connected to a gate of the fifteenth PMOSFET, a source of the fifteenth PMOSFET is connected to the operating voltage, a drain of the fifteenth PMOSFET is connected to a drain of the sixteenth PMOSFET, a source of the sixteenth PMOSFET is connected to the operating voltage, a gate of the sixteenth PMOSFET serves as a first negative differential input terminal, a source of the seventeenth PMOSFET is connected to the operating voltage, a drain of the seventeenth PMOSFET is connected to the drain of the fourteenth PMOSFET, a source of the eighteenth PMOSFET is connected to the operating voltage, a drain of the eighteenth PMOSFET is connected to the drain of the fifteenth PMOSFET, a drain of the twelfth NMOSFET is connected to the drain of the fourteenth PMOSFET, the drain of the twelfth NMOSFET serves as a negative differential output terminal, a gate of the twelfth NMOSFET is connected to a gate of the seventeenth PMOSFET and serves as a second positive differential input terminal, a source of the twelfth NMOSFET is connected to a drain of the thirteenth NMOSFET, a gate of the thirteenth NMOSFET is connected to a fifth bias voltage, a source of the thirteenth NMOSFET is connected to the ground, the drain of the thirteenth NMOSFET is also connected to a source of the fourteenth NMOSFET, a gate of the fourteenth NMOSFET is connected to a gate of the eighteenth PMOSFET and serves as a second negative differential input terminal, a drain of the fourteenth NMOSFET is connected to the drain of the fifteenth PMOSFET, the drain of the fourteenth NMOSFET serves as a positive differential output terminal, a non-inverting input terminal of the second operational amplifier is connected to a first end of the third resistor, a second end of the third resistor is connected to the drain of the twelfth NMOSFET, a non-inverting input terminal of the second operational amplifier is also connected to a first end of the fourth resistor, a second end of the fourth resistor is connected to the drain of the fourteenth NMOSFET, an inverting input terminal of the second operational amplifier is connected to a second reference signal, and an output terminal of the second operational amplifier is connected to the gate of the fourteenth PMOSFET.

6. The fourth-order feedforward compensation operational amplifier according to claim 5, wherein the fifth transconductance amplification unit adopts a differential amplification structure with common mode feedback, the fifth transconductance amplification unit includes a nineteenth PMOSFET, a twentieth PMOSFET, a twenty-first PMOSFET, a twenty-second PMOSFET, a fifteenth NMOSFET, a sixteenth NMOSFET, a seventeenth NMOSFET, a third operational amplifier, a fifth resistor, and a sixth resistor, and a source of the nineteenth PMOSFET is connected to the operating voltage, a gate of the nineteenth PMOSFET serves as a first positive differential input terminal, a drain of the nineteenth PMOSFET is connected to a drain of the twentieth PMOSFET, a source of the twentieth PMOSFET is connected to the operating voltage, a gate of the twentieth PMOSFET is connected to a gate of the twenty-first PMOSFET, a source of the twenty-first PMOSFET is connected to the operating voltage, a drain of the twenty-first PMOSFET is connected to a drain of the twenty-second PMOSFET, a source of the twenty-second PMOSFET is connected to the operating voltage, a gate of the twenty-second PMOSFET serves as a first negative differential input terminal, a drain of the fifteenth NMOSFET is connected to the drain of the nineteenth PMOSFET, the drain of the fifteenth NMOSFET serves as a negative differential output terminal, a gate of the fifteenth NMOSFET serves as a second positive differential input terminal, a source of the fifteenth NMOSFET is connected to a drain of the sixteenth NMOSFET, a gate of the sixteenth NMOSFET is connected to a sixth bias voltage, a source of the sixteenth NMOSFET is connected to the ground, the drain of the sixteenth NMOSFET is also connected to a source of the seventeenth NMOSFET, a gate of the seventeenth NMOSFET serves as a second negative differential input terminal, a drain of the seventeenth NMOSFET is connected to the drain of the twenty-first PMOSFET, the drain of the seventeenth NMOSFET serves as a positive differential output terminal, a non-inverting input terminal of the third operational amplifier is connected to a first end of the fifth resistor, a second end of the fifth resistor is connected to the drain of the fifteenth NMOSFET, the non-inverting input terminal of the third operational amplifier is also connected to a first end of the sixth resistor, a second end of the sixth resistor is connected to the drain of the seventeenth NMOSFET, an inverting input terminal of the third operational amplifier is connected to a third reference signal, and an output terminal of the third operational amplifier is connected to the gate of the twentieth PMOSFET.

7. The fourth-order feedforward compensation operational amplifier according to claim 6, wherein the sixth transconductance amplification unit adopts a complementary differential amplification structure with common mode feedback, the sixth transconductance amplification unit includes a twenty-third PMOSFET, a twenty-fourth PMOSFET, a twenty-fifth PMOSFET, a twenty-sixth PMOSFET, a twenty-seventh PMOSFET, a twenty-eighth PMOSFET, an eighteenth NMOSFET, a nineteenth NMOSFET, a twentieth NMOSFET, a fourth operational amplifier, a seventh resistor, and an eighth resistor, and a source of the twenty-third PMOSFET is connected to the operating voltage, a gate of twenty-third PMOSFET serves as a first positive differential input terminal, a drain of the twenty-third PMOSFET is connected to a drain of the twenty-fourth PMOSFET, a source of the twenty-fourth PMOSFET is connected to the operating voltage, a gate of the twenty-fourth PMOSFET is connected to a gate of the twenty-fifth PMOSFET, a source of the twenty-fifth PMOSFET is connected to the operating voltage, a drain of the twenty-fifth PMOSFET is connected to a drain of the twenty-sixth PMOSFET, a source of the twenty-sixth PMOSFET is connected to the operating voltage, a gate of the twenty-sixth PMOSFET serves as a first negative differential input terminal, a source of the twenty-seventh PMOSFET is connected to the operating voltage, a drain of the twenty-seventh PMOSFET is connected to the drain of the twenty-fourth PMOSFET, a source of the twenty-eighth PMOSFET is connected to the operating voltage, a drain of the twenty-eighth PMOSFET is connected to the drain of the twenty-fifth PMOSFET, a drain of the eighteenth NMOSFET is connected to the drain of the twenty-fourth PMOSFET, the drain of the eighteenth NMOSFET serves as a negative differential output terminal, a gate of the eighteenth NMOSFET is connected to a gate of the twenty-seventh PMOSFET and serves as a second positive differential input terminal, a source of the eighteenth NMOSFET is connected to a drain of the nineteenth NMOSFET, a gate of the nineteenth NMOSFET is connected to a seventh bias voltage, a source of the nineteenth NMOSFET is connected to the ground, the drain of the nineteenth NMOSFET is also connected to a source of the twentieth NMOSFET, a gate of the twentieth NMOSFET is connected to a gate of the twenty-eighth PMOSFET and serves as a second negative differential input terminal, a drain of the twentieth NMOSFET is connected to the drain of the twenty-fifth PMOSFET, the drain of the twentieth NMOSFET serves as a positive differential output terminal, a non-inverting input terminal of the fourth operational amplifier is connected to a first end of the seventh resistor, a second end of the seventh resistor is connected to the drain of the eighteenth NMOSFET, the non-inverting input terminal of the fourth operational amplifier is also connected to a first end of the eighth resistor, a second end of the eighth resistor is connected to the drain of the twentieth NMOSFET, an inverting input terminal of the fourth operational amplifier is connected to a fourth reference signal, and an output terminal of the fourth operational amplifier is connected to the gate of the twenty-fourth PMOSFET.

8. The fourth-order feedforward compensation operational amplifier according to claim 7, wherein the seventh transconductance amplification unit adopts a complementary differential amplification structure, the seventh transconductance amplification unit includes a twenty-ninth PMOSFET, a thirtieth PMOSFET, a thirty-first PMOSFET, a thirty-second PMOSFET, a thirty-third PMOSFET, a thirty-fourth PMOSFET, a twenty-first NMOSFET, a twenty-second NMOSFET, a twenty-third NMOSFET, a first capacitor, and a second capacitor, and a source of the twenty-ninth PMOSFET is connected to the operating voltage, a gate of the twenty-ninth PMOSFET is connected to a drain of the twenty-ninth PMOSFET, the drain of the twenty-ninth PMOSFET is connected to a drain of the thirtieth PMOSFET, a source of the thirtieth PMOSFET is connected to the operating voltage, a gate of the thirtieth PMOSFET is connected to a drain of the thirty-first PMOSFET, a source of the thirty-first PMOSFET is connected to the operating voltage, a gate of the thirty-first PMOSFET is connected to the drain of the thirtieth PMOSFET, the drain of the thirty-first PMOSFET is connected to a drain of the thirty-second PMOSFET, a source of the thirty-second PMOSFET is connected to the operating voltage, a gate of the thirty-second PMOSFET is connected to the drain of the thirty-second PMOSFET, a source of the thirty-third PMOSFET is connected to the operating voltage, a drain of the thirty-third PMOSFET is connected to the drain of the thirtieth PMOSFET, a source of the thirty-fourth PMOSFET is connected to the operating voltage, a drain of the thirty-fourth PMOSFET is connected to the drain of the thirty-first PMOSFET, a drain of the twenty-first NMOSFET is connected to the drain of the thirtieth PMOSFET, the drain of the twenty-first NMOSFET is connected to a first end of the first capacitor, a second end of the first capacitor serves as a negative differential output terminal, a gate of the twenty-first NMOSFET is connected to a gate of the thirty-third PMOSFET and serves as a positive differential input terminal, a source of the twenty-first NMOSFET is connected to a drain of the twenty-second NMOSFET, a gate of the twenty-second NMOSFET is connected to an eighth bias voltage, a source of the twenty-second NMOSFET is connected to the ground, the drain of the twenty-second NMOSFET is also connected to a source of the twenty-third NMOSFET, a gate of the twenty-third NMOSFET is connected to a gate of the thirty-fourth PMOSFET and serves as a negative differential input terminal, a drain of the twenty-third NMOSFET is connected to the drain of the thirty-first PMOSFET, and the drain of the twenty-third NMOSFET is connected to a first end of the second capacitor, and a second end of the second capacitor serves as a positive differential output terminal.

9. The fourth-order feedforward compensation operational amplifier according to claim 1, wherein the fourth-order feedforward compensation operational amplifier is designed based on a 65 nm CMOS process.

10. A method for designing a fourth-order feedforward compensation operational amplifier, comprising:

providing a first transconductance amplification unit, a second transconductance amplification unit, a third transconductance amplification unit, a fourth transconductance amplification unit, a fifth transconductance amplification unit, a sixth transconductance amplification unit, and a seventh transconductance amplification unit;

using the first transconductance amplification unit, the second transconductance amplification unit, the third transconductance amplification unit, and the fourth transconductance amplification unit to form a fourth-order operational amplifier path;

using the first transconductance amplification unit, the fifth transconductance amplification unit, and the fourth transconductance amplification unit to form a third-order operational amplifier path, and performing feedforward compensation on the fourth-order operational amplifier path through the third-order operational amplifier path;

using the first transconductance amplification unit and the sixth transconductance amplification unit to form a second-order operational amplifier path, and performing feedforward compensation on the third-order operational amplifier path through the second-order operational amplifier path; and using the seventh transconductance amplifier unit to form a first-order operational amplifier path, and performing feedforward compensation on the second-order operational amplifier path through the first-order operational amplifier path.

11. The method for designing a fourth-order feedforward compensation operational amplifier according to claim 10, further comprising:

forming the first transconductance amplification unit based on a cascode differential amplification technology;

forming the second transconductance amplification unit based on a differential amplification technology;

forming the third transconductance amplification unit and the fifth transconductance amplification unit based on a differential amplification technology with common mode feedback;

forming the fourth transconductance amplification unit and the sixth transconductance amplification unit based on a complementary differential amplification technology with common mode feedback; and forming the seventh transconductance amplification unit based on a complementary differential amplification technology.

* * * * *